US009227318B1

(12) United States Patent
Bai et al.

(10) Patent No.: US 9,227,318 B1
(45) Date of Patent: Jan. 5, 2016

(54) OPTIMAL BUFFER SPACE CONFIGURATION AND SCHEDULING FOR SINGLE-ARM MULTI-CLUSTER TOOLS

(71) Applicant: Macau University of Science and Technology, Macau (MO)

(72) Inventors: Liping Bai, Mo (MO); Naiqi Wu, Mo (MO); Zhiwu Li, Mo (MO); Mengchu Zhou, Newark, NJ (US)

(73) Assignee: Macau University of Science and Technology, Macau (MO)

( * ) Notice: Subject to any disclaimer, the term of this patent is extended or adjusted under 35 U.S.C. 154(b) by 0 days.

(21) Appl. No.: 14/639,137

(22) Filed: Mar. 5, 2015

Related U.S. Application Data

(60) Provisional application No. 62/102,108, filed on Jan. 12, 2015.

(51) Int. Cl.
*G06F 19/00* (2011.01)
*B25J 9/00* (2006.01)
*G05B 19/418* (2006.01)
*G06F 17/50* (2006.01)

(52) U.S. Cl.
CPC ........... *B25J 9/009* (2013.01); *G05B 19/41865* (2013.01); *G06F 17/5013* (2013.01); *G05B 2219/45032* (2013.01); *Y10S 901/02* (2013.01); *Y10S 901/41* (2013.01)

(58) Field of Classification Search
CPC .............. B25J 9/009; G05B 19/41865; G05B 2219/45031; G05B 2219/45032
USPC ......................................................... 700/100
See application file for complete search history.

(56) References Cited

U.S. PATENT DOCUMENTS

| 6,519,498 B1 * | 2/2003 | Jevtic ............... G05B 19/41865 700/100 |
| 2008/0051930 A1 * | 2/2008 | Oh ..................... H01L 21/67276 700/214 |

OTHER PUBLICATIONS

FaJun Yang, NaiQi Wu, Yan Qiao, and MengChu Zhou, "Optimal Scheduling of Single-Arm Multi-Cluster Tools with Two-Space Buffering Modules", 2014 IEEE International Conference on Automation Science and Engineering, Taipei, Taiwan, Aug. 18-22, 2014.*

(Continued)

*Primary Examiner* — Robert Fennema
*Assistant Examiner* — Sivalingam Sivanesan
(74) *Attorney, Agent, or Firm* — Ella Cheong Hong Kong; Sam T. Yip

(57) ABSTRACT

A method for scheduling single-arm multi-cluster tools is provided. The present invention studies the scheduling problem of a single-arm multi-cluster tool with a linear topology and process-bound bottleneck individual tool. Its objective is to find a one-wafer cyclic schedule such that the lower bound of cycle time is reached by optimally configuring spaces in buffering modules that link individual cluster tools. A Petri net model is developed to describe the dynamic behavior of the system by extending resource-oriented Petri nets such that a schedule can be parameterized by robots' waiting time. Based on this model, conditions are presented under which a one-wafer cyclic schedule with lower bound of cycle time can be found. With the derived conditions, an algorithm is presented to find such a schedule and optimally configure the buffer spaces.

10 Claims, 4 Drawing Sheets

(56) References Cited

OTHER PUBLICATIONS

QingHua Zhu, NaiQi Wu, Yan Qiao, and MengChu Zhou, "Scheduling of Single-Arm Multi-Cluster Tools to Achieve the Minimum Cycle Time", 2013 IEEE International Conference on Robotics and Automation, Karlsruhe, Germany, May 6-10, 2013.*

QingHua Zhu, NaiQi Wu, Yan Qiao, and MengChu Zhou, "Modeling and Schedulability Analysis of Single-Arm Multi-Cluster Tools with Residenecy Time Constraints via Petri Nets", 2014 IEEE International Conference on Automation Science and Engineering, Tapei, Taiwan, Aug. 18-22, 2014.*

QingHua Zhu and Yan Qiao, "Scheduling Single-Arm Multi-Cluster Tools with Lower Bound Cycle Time via Petri Nets", International Journal of interlligent control and systems, Vo. 17, No. 4, Dec. 2012, 113-123.*

* cited by examiner

US 9,227,318 B1

OPTIMAL BUFFER SPACE CONFIGURATION AND SCHEDULING FOR SINGLE-ARM MULTI-CLUSTER TOOLS

CLAIM FOR DOMESTIC PRIORITY

This application claims priority under 35 U.S.C. §119 to the U.S. Provisional Patent Application No. 62/102,108 filed Jan. 12, 2015, the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a method for scheduling single-arm multi-cluster tools with optimal buffer space configuration.

BACKGROUND

The following references are cited in the specification. Disclosures of these references are incorporated herein by reference in their entirety.
List of References
W. K. Chan, J. G. Yi, and S. W. Ding, "Optimal Scheduling of Multi-cluster Tools with Constant Robot Moving Times, Part I: Two-Cluster Analysis," *IEEE Transactions on Automation Science and Engineering*, vol. 8, pp. 5-16, 2011a.
W. K. Chan, J. G. Yi, S. W. Ding, and D. Z. Song, "Optimal Scheduling of Multi-cluster Tools with Constant Robot Moving Times, Part II: Tree-Like Topology Configurations," *IEEE Transactions on Automation Science and Engineering*, vol. 8, pp. 17-28, 2011b.
M. Dawande, C. Sriskandarajah, and S. Sethi, "On throughput maximization in constant travel-time robotic cells", *Manufacturing and Service Operations Management*, vol. 4, no. 4, 296-312, 2002.
S. W. Ding, J. G. Yi, and M. T. Zhang, "Multicluster Tools Scheduling: an Integrated Event Graph and Network Model Approach," *IEEE Transactions on Semiconductor Manufacturing*, vol. 19, pp. 339-351, 2006.
I. Drobouchevitch, S. P. Sethi, and C. Sriskandarajah, "Scheduling Dual Gripper Robotic Cells: One-unit Cycles," *European Journal of Operational Research*, vol. 171, pp. 598-631, 2006.
D. Jevtic, "Method and Apparatus for Managing Scheduling a Multiple Cluster Tool," in European Patent. vol. 1,132, 792(A2), 2001.
D. Jevtic and S. Venkatesh, "Method and Apparatus for Scheduling Wafer Processing within a Multiple Chamber Semiconductor Wafer Processing Tool Having a Multiple Blade Robot," in U.S. Pat. No. 6,224,638, 2001.
J.-H. Kim, T.-E. Lee, H.-Y. Lee, and D.-B. Park, Scheduling analysis of timed-constrained dual-armed cluster tools, *IEEE Transactions on Semiconductor Manufacturing*, vol. 16, no. 3, 521-534, 2003.
T.-E. Lee, H.-Y. Lee, and Y.-H. Shin, Workload balancing and scheduling of a single-armed cluster tool, in *Proceedings of the 5th APIEMS Conference*, Gold Coast, Australia, 1-15, 2004.
T.-E. Lee and S.-H. Park, "An extended event graph with negative places and tokens for timed window constraints," *IEEE Transactions on Automation Science and Engineering*, vol. 2, no. 4, 319-332, 2005.
M.-J. Lopez and S.-C. Wood, Systems of multiple cluster tools—configuration, reliability, and performance, *IEEE Transactions on Semiconductor Manufacturing*, vol. 16, no. 2, 170-178, 2003.
T. L. Perkinson, R. S. Gyurcsik, and P. K. MacLarty, "Single-wafer cluster tool performance: An analysis of the effects of redundant chambers and revisitations sequences on throughput," *IEEE Transactions on Semiconductor Manufacturing*, vol. 9, 384-400, 1996.
T. L. Perkinson, P. K. MacLarty, R. S. Gyurcsik, and R. K. Cavin, III, "Single-wafer cluster tool performance: An analysis of throughput," *IEEE Transactions on Semiconductor Manufacturing*, vol. 7, 369-373, 1994.
S. Rostami, B. Hamidzadeh, and D. Camporese, "An optimal periodic scheduler for dual-arm robots in cluster tools with residency constraints," *IEEE Transactions on Robotics and Automation*, vol. 17, 609-618, 2001.
S. Venkatesh, R. Davenport, P. Foxhoven, and J. Nulman, A steady state throughput analysis of cluster tools: Dual-blade versus single-blade robots, *IEEE Trans. Semi-conduct. Manuf.*, vol.10, pp. 418-424, 1997.
N. Q. Wu, " Necessary and Sufficient Conditions for Deadlock-free Operation in Flexible Manufacturing System Using a Colored Petri Net Model," *IEEE Transaction on System, Man, and Cybernetics, Part C*, vol. 29, pp. 192-204, 1999.
N. Q. Wu, C. B. Chu, F. Chu, and M. C. Zhou, "A Petri net method for schedulability and scheduling problems in single-arm cluster tools with wafer residency time constraints," *IEEE Transactions on Semiconductor Manufacturing*, vol. 21, pp. 224-237, 2008a.
N. Q. Wu, F. Chu, C. Chu, and M. Zhou, "Petri Net-Based Scheduling of Single-Arm Cluster Tools With Reentrant Atomic Layer Deposition Processes," *IEEE Transactions on Automation Science and Engineering*, vol. 8, pp. 42-55, January 2011.
N. Q. Wu, F. Chu, C. B. Chu, and M. C. Zhou, "Petri net modeling and cycle time analysis of dual-arm cluster tools with wafer revisiting," *IEEE Transactions on Systems, Man, & Cybernetics, Part A*, in press, 2012.
N. Q. Wu and M. C. Zhou, *System modeling and control with resource-oriented Petri nets*, CRC Press, Taylor & Francis Group, New York, October 2009.
N. Q. Wu and M. C. Zhou, "Analysis of wafer sojourn time in dual-arm cluster tools with residency time constraint and activity time variation," *IEEE Transactions on Semiconductor Manufacturing*, vol. 23, pp. 53-64, 2010a.
N. Q. Wu and M. C. Zhou, "A closed-form solution for schedulability and optimal scheduling of dual-arm cluster tools based on steady schedule analysis," *IEEE Transactions on Automation Science and Engineering*, vol. 7, no. 2, 303-315, 2010b.
N. Q. Wu and M. C. Zhou, Process vs resource-oriented Petri net modeling of automated manufacturing systems, *Asian Journal of Control*, vol. 12, no. 3, 267-280, 2010c.
N. Q. Wu and M. C. Zhou, "Modeling, analysis and control of dual-arm cluster tools with residency time constraint and activity time variation based on Petri nets," *IEEE Transactions on Automation Science and Engineering*, vol. 9, no. 2, 446-454, 2012a.

N. Q. Wu and M. C. Zhou, "Schedulability analysis and optimal scheduling of dual-arm cluster tools with residency time constraint and activity time variation," *IEEE Transactions on Automation Science and Engineering*, vol. 9, no. 1, 203-209, 2012b.

N. Q. Wu, M. C. Zhou, and Z. W. Li, Resource-oriented Petri net for deadlock avoidance in flexible assembly systems, *IEEE Transactions on System, Man, & Cybernetics, Part A*, vol. 38, no. 1, 56-69, 2008b.

F. J. Yang, N. Q. Wu, Y. Qiao, and M. C. Zhou, Petri net-based optimal one-wafer cyclic scheduling of hybrid multi-cluster tools in wafer fabrication, *IEEE Transactions on Semiconductor Manufacturing*, vol. 27, no. 2, 192-203, 2014a.

F. J. Yang, N. Q. Wu, Y. Qiao, and M. C. Zhou, Optimal one-wafer cyclic scheduling of single-arm multi-cluster tools with two-space buffering modules, *IEEE Transactions on Systems, Man, & Cybernetics: Systems*, vol. 44, no. 12, 1584-1597, 2014b.

J. G. Yi, S. W. Ding, D. Z. Song, and M. T. Zhang, "Steady-State Throughput and Scheduling Analysis of Multi-Cluster Tools for Semiconductor Manufacturing: A Decomposition Approach," *IEEE Transactions on Automation Science and Engineering*, vol. 5, pp. 321-336, 2008.

M. C. Zhou and K. Venkatesh, *Modeling, simulation and control of flexible manufacturing systems: Petri net approach*, World Scientific, Singapore, 1998.

Q. H. Zhu, N. Q. Wu, Y. Qiao, and M. C. Zhou, Petri net-based optimal one-wafer scheduling of single-arm multi-cluster tools in semiconductor manufacturing, *IEEE Transactions on Semiconductor Manufacturing*, vol. 26, no. 4, 578-591, 2013.

W. M. Zuberek, "Timed Petri nets in modeling and analysis of cluster tools," *IEEE Transactions on Robotics Automation*, vol. 17, no. 5, pp. 562-575, October 2001.

Since two decades ago, cluster tools have been increasingly adopted in wafer fabrication for high quality and low lead time. In general, a cluster tool integrates several process modules (PMs), a wafer handle robot (R), and one or more loadlocks (LL) for wafer cassette loading/unloading. In operating a cluster tool, a raw wafer in a loadlock is transported to PMs one by one in a specific sequence, and finally returns to the loadlock where it comes from. The robot executes loading, transportation, and unloading operations. It can be a single or dual-arm one, thus resulting in a single or dual-arm cluster tool. A multi-cluster tool is composed of multiple single-cluster tools, as shown in FIG. 1, which are interconnected via buffers with finite capacity for holding incoming and outgoing wafers.

Extensive studies have been done in modeling, analysis, scheduling, and performance evaluation for single-cluster tools [Perkinson et al., 1994 and 1996; Venkatesh et al., 1997; Zuberek, 2001; Wu et al., 2011 and 2012; and Wu and Zhou, 2010a, 2012a, and 2012b]. These studies reveal that a cluster tool operates in a steady state for most of time. A cluster tool operates in one of two modes called transport-bound and process-bound regions. When the wafer processing time dominates the operations such that the robot has idle time, it is process-bound, otherwise it is transport-bound if the robot is always busy. Practically, the robot task time is much shorter than wafer processing time and can be assumed to be a constant [Kim et al., 2003]. Thus, in practice, a cluster tool is often process-bound. In a process-bound region, a pull schedule (backward schedule) is optimal for a single-arm cluster tool [Kim et al., 2003; Lee et al. 2004; Lopez and Wood, 2003; and Dawande, 2002], and a swap scheduling is optimal for a dual-arm cluster tool [Venkatesh et al., 1997; and Drobouchevich et al., 2006]. However, these results are applicable only when there is no strict wafer residency time constraint.

Some wafer fabrication processes must meet strict wafer residency time constraints, thus leading to a complex scheduling problem [Kim et al., 2003; and Lee and Park, 2005]. Studies have been done for scheduling dual-arm cluster tools with wafer residency time constraints in [Kim et al., 2003; Lee and Park, 2005; and Rostami et al., 2001], and methods for finding an optimal periodic schedule are presented. To improve computational efficiency, this problem is further studied in [Wu et al., 2008a; and Wu and Zhou, 2010a, 2010b, 2012a, and 2012b] for both single-arm and dual-arm cluster tools. They develop a type of Petri net models by explicitly describing the robot waiting. Based on these models, an optimal cyclic schedule can be found by simply determining when and how long the robot should wait such that closed-form scheduling algorithms are developed to find such a schedule. Thereafter, one calls such a method a robot waiting method.

In order to meet complex manufacturing conditions, multi-cluster tools have been used in industry for more than a decade. Since the interconnection of single-cluster tools results in coupling and dependence of the single-cluster tools, their analysis and scheduling are more complicated than that of a single-cluster tool [Chan et al., 2011a]. Up to now, there are only a few research reports on this issue. Based on priority rules, heuristics for their scheduling are proposed in [Jevtic, 2001, Jevtic and Venkatesh, 2001]. Since it is difficult to evaluate the performance of a heuristic method, Ding et al. [2006] develop an integrated event graph and network models for them. Then, an extended critical path method is presented to find a periodic schedule. By ignoring the robot moving time, a decomposition approach is presented for scheduling them [Yi et al., 2008]. By this approach, they are decomposed into individual tools and the fundamental period (FP) of each single-cluster tool is calculated. Then, the FP for the whole system can be obtained by analyzing the robot operations in accessing the buffer modules (BMs). With constant robot moving time, Chan et al. [2011a and 2011b] subsequently tackle their scheduling problem. They develop a polynomial algorithm to find an optimal multi-wafer cyclic schedule.

Since robot task time is much shorter than wafer processing time in practice, a single-cluster tool is mostly process-bound. Hence, the present invention assumes that the bottleneck single-cluster tool in a multi-cluster tool is process-bound. Such a multi-cluster tool is called a process-dominant one [Zhu et al., 2013]. For a process-dominant one, the FP of its bottleneck single-cluster tool must be the lower bound of cycle time for the entire system. It is well-known that a one-wafer cyclic schedule is easy to understand, implement, and control to guarantee uniform product quality [Dawande et al., 2002; and Drobouchevitch et al., 2006]. Thus, it is highly desirable to have an optimal one-wafer cyclic schedule for a multi-cluster tool.

Aiming at finding an optimal one-wafer cyclic schedule, Zhu et al. [2013] study the scheduling problem of a process-dominant multi-cluster tool with a linear topology by using the robot waiting method. Their multi-cluster tool is composed of single-arm cluster tools and single-capacity BMs. They show that there is always an optimal one-wafer cyclic schedule for such a multi-cluster tool and efficient algorithms are developed to find such a schedule. They also present the conditions under which the lower bound of cycle time can be reached by a one-wafer cyclic schedule. For the same systems, this scheduling problem is further studied in [Yang et al., 2014]. It is shown that a one-wafer cyclic schedule to reach the lower bound of cycle time can be always found if all the BMs have two spaces. These results are very important for scheduling multi-cluster tools.

By the aforementioned studies, it is known that, with one-space BMs, the lower bound of cycle time may not be reached by a one-wafer cyclic schedule, which implies productivity loss. With two-space BMs, the maximal productivity is reached. However, cost must be paid for additional spaces. Thus, an interesting and significant question is how to optimally configure the buffer spaces such that a one-wafer cyclic schedule is found to reach the maximal productivity. This motivates us to conduct this study. As done in [Zhu et al., 2013; and Yang et al., 2014], one studies a single-arm process-dominant multi-cluster tool with linear topology. A Petri net (PN) model is developed to describe the dynamic behavior of the system with one or two spaces in a BM. With this model, based on the robot waiting method, one derives the conditions under which a one-wafer cyclic schedule with the lower bound of cycle time can be found for an individual tool such that this tool can operate as if it is independent. Then, an algorithm is presented to find such a schedule and configure the buffer spaces. This algorithm involves simple calculations for setting the robot waiting time and is computationally efficient. Further, the buffer space configuration is optimal in terms of the number of buffer spaces needed.

There is a need in the art for a method for scheduling single-arm multi-cluster tools with optimal buffer space configuration.

SUMMARY OF THE INVENTION

An aspect of the present invention is to provide a method for scheduling single-arm multi-cluster tools with optimal buffer space configuration.

According to an embodiment of the present claimed invention, a method for scheduling single-arm multi-cluster tools with optimal buffer space configuration, comprises: obtaining, by a processor, a wafer processing time, a robot wafer loading and unloading time, and a robot moving time; calculating, by a processor, a shortest time for completing a wafer based on the wafer processing time, the robot wafer loading and unloading time, and the robot moving time; calculating, by a processor, a robot cycle time based on the robot wafer loading and unloading time, and the robot moving time; determining, by a processor, a fundamental period based on selecting a maximum value among the shortest time for completing the wafer and the robot cycling time; determining, by a processor, a type of cluster tool by: if the fundamental period is a value of the shortest time for completing the wafer, the type of cluster tool is process-bound; otherwise the type of cluster tool is a transport-bound; determining, by a processor, the multi-cluster tools to be process-bound, or transport-bound based on the type of cluster tool having a maximum value of the fundamental period; determining, by a processor, a lower bound of cycle time based on the maximum value of the fundamental period; determining, by a processor, an algorithm for scheduling and buffer space configuration based on a petri net model; and calculating, by a processor, a robot waiting time based on the algorithm; calculating, by a processor, a wafer sojourn time based on the algorithm and the lower bound of cycle time; determining, by a processor, a buffer space for buffer module based on the wafer sojourn time and the robot waiting time; and obtaining, by a processor, a schedule based on the buffer space for buffer module and the lower bound of cycle time.

The present invention studies the scheduling problem of a single-arm multi-cluster tool with a linear topology and process-bound bottleneck individual tool. Its objective is to find a one-wafer cyclic schedule such that the lower bound of cycle time is reached by optimally configuring spaces in buffering modules that link individual cluster tools. A Petri net model is developed to describe the dynamic behavior of the system by extending resource-oriented Petri nets such that a schedule can be parameterized by robots' waiting time. Based on this model, conditions are presented under which a one-wafer cyclic schedule with lower bound of cycle time can be found. With the derived conditions, an algorithm is presented to find such a schedule and optimally configure the buffer spaces. This algorithm requires only simple calculation to set the robots' waiting time and configure the buffer space. Illustrative examples are presented to show the application and power of the proposed method.

BRIEF DESCRIPTION OF THE DRAWINGS

Embodiments of the present invention are described in more detail hereinafter with reference to the drawings, in which.

DETAILED DESCRIPTION

In the following description, a method for scheduling single-arm multi-cluster tools with optimal buffer space configuration is set forth as preferred examples. It will be apparent to those skilled in the art that modifications, including additions and/or substitutions maybe made without departing from the scope and spirit of the invention. Specific details may be omitted so as not to obscure the invention; however, the disclosure is written to enable one skilled in the art to practice the teachings herein without undue experimentation.

In Section A, a PN model is developed. Based on it, Section B gives the method for scheduling a single-cluster tool by setting robot waiting time. Section C derives the conditions under which a one-wafer cyclic schedule with the lower bound of cycle time can be obtained for an individual tool. Then, an efficient algorithm for scheduling a multi-cluster tool and configuring the buffer spaces is proposed. Examples are used to show the applications of the proposed method in Section D.

A. System Modeling

Figure 1:
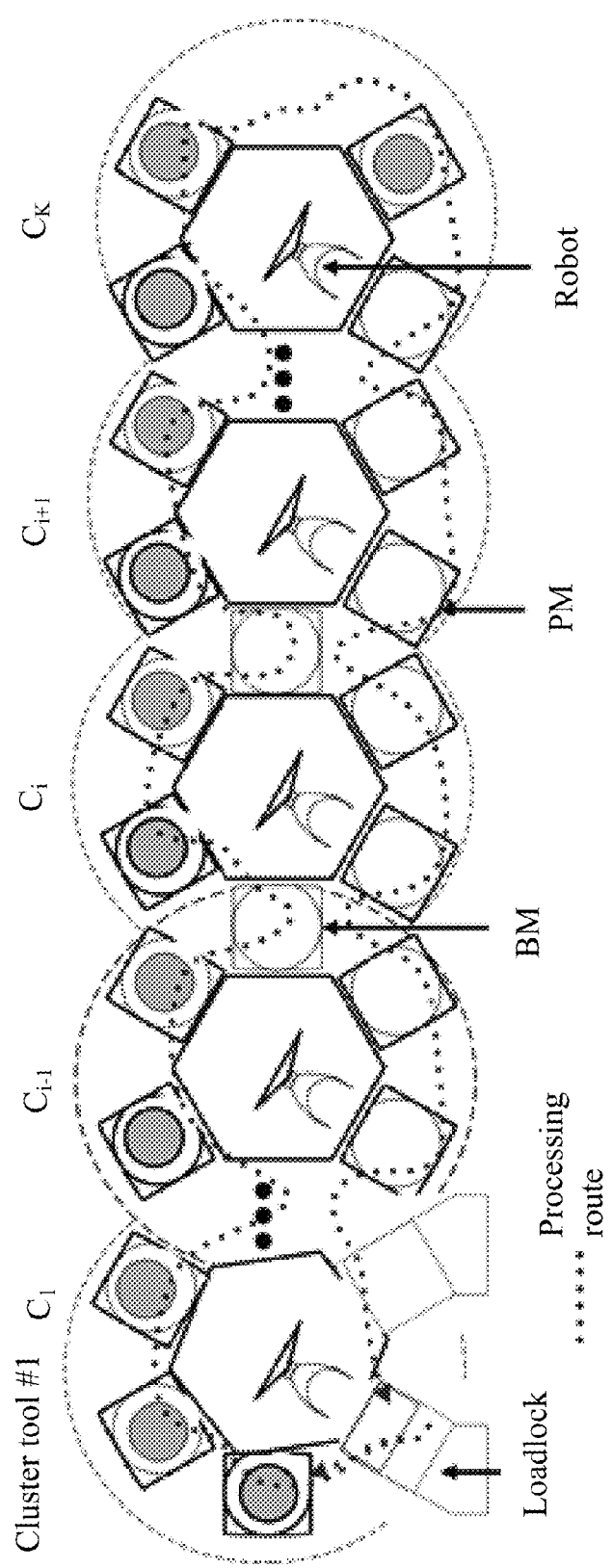
FIG. 1 shows a multi-cluster tool with a linear topology.

A multi-cluster tool composed of K individual single-cluster tools is called a K-cluster tool. Topologically, a K-cluster tool can be linear or tree-like. The present invention conducts the scheduling and buffer space configuration problem for a linear and process-dominant K-cluster tool composed of single-arm cluster tools as shown in FIG. 1. Thereafter, a K-cluster tool means such a multi-cluster tool unless otherwise specified. Let $\mathbb{N}_n = \{1, 2, \ldots, n\}$ and $\Omega_n = \{0\} \cup \mathbb{N}_n$. The i-th tool in a K-cluster tool is denoted by $C_i$, $i \in \mathbb{N}_K$, with $C_1$ and $C_K$ being the head and tail ones. In $C_i$, $i \in \mathbb{N}_{K-1}$, there is at least one processing step and, in $C_K$, there are at least two processing steps, since otherwise it is not meaningful and can be removed from a K-cluster tool. For scheduling, the load-locks and BMs linking the individual tools can be treated as processing steps with processing time being zero. The BM linking $C_i$ and $C_{i+1}$ is used to deliver wafers from $C_i$ to $C_{i+1}$. Thus, this BM is called the outgoing buffer for $C_i$ and incoming one for $C_{i+1}$. Assume that there are totally $n[i]+1$ steps in $C_i$, $i \in \mathbb{N}_K$, including the steps for BMs. In $C_i$, one numbers the incoming BM as Step 0 and the last step as Step n[i], and the other steps are numbered in this order. Multiple PMs can be configured to serve for a step. Since the results obtained in the present invention can be extended to multi-PM-step case, it is assumed that there is one PM for each processing step. However, a step representing a BM can have more than one space. The j-th step, $j \in \Omega_{n[i]}$, in $C_i$ is denoted by $PS_{ij}$. The BM linking $C_i$ and $C_{i+1}$ is numbered as Steps b[i] and 0, and denoted by $PS_{i(b[i])}$ and $PS_{(i+1)0}$, for $C_i$ and $C_{i+1}$, respectively. Let $R_i$ be the robot in $C_i$. In this way, the steps in $C_i$ are $PS_{i0}$, $PS_{i1}, \ldots, PS_{i(b[i])}, PS_{i(b[i]+1)}, \ldots, PS_{i(n[i])}$, where $PS_{i0}$ and $PS_{i(b[i])}$ represent the incoming and outgoing steps, respectively. The wafer processing route is: $PS_{10} \to PS_{11} \to \ldots \to PS_{1(b[1])}(PS_{20}) \to PS_{21} \to \ldots \to PS_{2(b[2])}(PS_{30}) \to \ldots \to PS_{(K-1)(b[K-1])}(PS_{K0}) \to PS_{K1} \to \ldots \to PS_{K(n[K])} \to \cdot \cdot \cdot \to PS_{K0}(PS_{(K-1)(b[K-1])}) \to PS_{(K-1)(b[K-1]+1)} \to \cdot \cdot \cdot \to PS_{30}(PS_{2(b[2])}) \to PS_{2(b[2]+1)} \to \ldots \to PS_{20}(PS_{1(b[1])}) \to \ldots \to PS_{1(n[1])} \to PS_{10}$.

For a K-cluster tool studied in the present invention, as done in [Chan et al., 2011a and 2011b], one assumes that: 1) all the wafers follow an identical processing sequence as given above and visit each PM only once; 2) a PM can process one wafer at a time; 3) the activity time is deterministic and known; 4) the loading and unloading time of a robot is the same; and 5) each BM can hold either one or two wafers.

A.1 Modeling Wafer Flow

As an effective tool for modeling concurrent activities, Petri nets (PN) are widely adopted for modeling manufacturing systems. The present invention extends resource-oriented PN developed in [Wu, 1999; Wu and Zhou, 2001 and 2010c; and Wu et al., 2008b] to model a K-cluster tool. The basic concept of PN can be seen in [Zhou and Venkatesh, 1998; and Wu and Zhou, 2009]. It is kind of finite capacity PN defined as $PN = (P, T, I, O, \Omega, M, \Gamma)$, where $P = \{p_1, p_2, \ldots, p_m\}$ is a finite set of places; $T = \{t_1, t_2, \ldots, t_n\}$ is a finite set of transitions with $P \cup T \neq \emptyset$ and $P \cap T = \emptyset$; $I: P \times T \to \mathbb{N} = \{0, 1, 2, \ldots\}$ is an input function; $O: P \times T \to \mathbb{N}$ is an output function; $\Omega: P \to \{c_1, c_2, \ldots, c_n\}$ and $\Omega: T \to \{c_1, c_2, \ldots, c_n\}$ is a color function; $M: P \to \mathbb{N}$ is a marking representing the number of tokens in places with $M_0$ being the initial marking; and $\Gamma: P \to \{1, 2, 3, \ldots\}$ is a capacity function, where $\Gamma(p)$ denotes the largest number of tokens that p can hold at a time. The preset of transition t is the set of all input places to t, i.e., $\bullet t = \{p: p \in P \text{ and } I(p, t) > 0\}$. Its postset is the set of all output places from t, i.e., $t \bullet = \{p: p \in P \text{ and } O(p, t) > 0\}$. Similarly, p's preset $\bullet p = \{t \in T: O(p, t) > 0\}$ and postset $p \bullet = \{t \in T: I(p, t) > 0\}$. The transition enabling and firing rules can be found in [Wu and Zhou, 2009 and 2010c].

The set of all markings reachable from $M_0$ is denoted as $R(M_0)$. A transition in a PN is live if it can fire at least once in some firing sequence for every marking $M \in R(M_0)$. A PN is live if every transition is live. The liveness of a PN can make sure all events or activities in the model to happen.

A.2 PN for K-Cluster Tools

In the operations of a K-cluster tool, there are mainly three states: initial transient state, steady state, and final transient one. Although the present invention focuses on finding a cyclic schedule at the steady state, there is an initial transient process for a cluster tool to enter a steady state and there is a final transient process when a cluster tool needs to terminate. Hence, it is meaningful to develop a model that can describe the dynamic behavior of all the three states. The key for scheduling a K-cluster tool is to coordinate the activities of its multiple robots in accessing BMs. Thus, if each individual cluster tool and BMs are modeled, the dynamic behavior of a K-cluster tool is well described. Thus, one develops PN models for a single-cluster tool and BM as follows.

Figure 2:
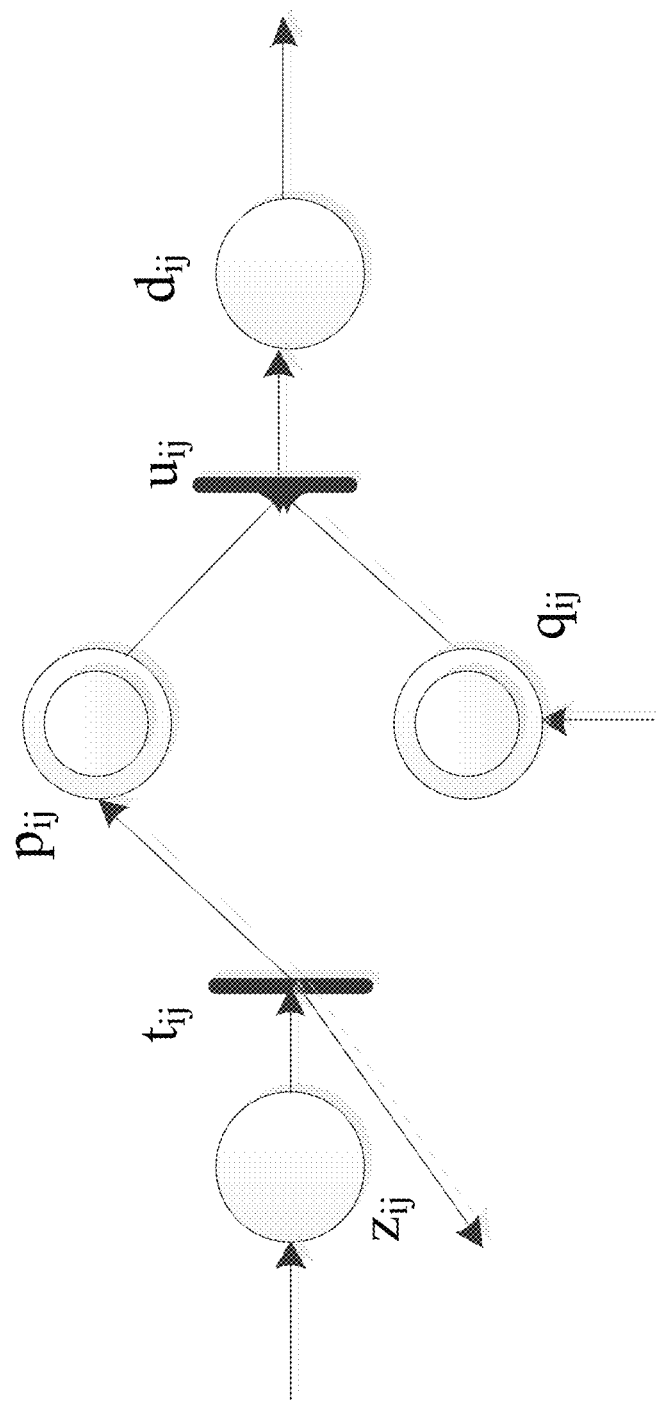
FIG. 2 depicts a PN model for processing Step $PS_{ij}$.

First, one presents the model for $PS_{ij}$ in $C_i$ as shown in FIG. 2. Timed place $p_{ij}$ with $\Gamma(p_{ij}) = 1$, $i \in \mathbb{N}_K$, and $j \in \Omega_{n[i]} \setminus \{0, b[i]\}$ is used to model the PM for the step. $PS_{10}$ for the loadlocks in $C_1$ is treated as a step and is modeled by $p_{10}$ with $\Gamma(p_{10}) = \infty$, representing that it can hold and remove all the wafers in process. With a robot waiting method being used in the present invention, robot waiting is explicitly modeled. Timed $q_{ij}$ with $\Gamma(q_{ij}) = 1$ is used to model $R_i$'s waiting at step $j \in \Omega_{n[i]}$ for unloading a wafer at $SP_{ij}$. Non-timed $z_{ij}$ and $d_{ij}$ with $\Gamma(z_{ij}) = \Gamma(d_{ij}) = 1$ model $R_i$'s holding a wafer for loading into $p_{ij}$ and moving to Step j+1 (or step 0, if j=n[i]), respectively. Timed $t_{ij}$ and $u_{ij}$ model $R_i$'s loading and unloading a wafer into and from $p_{ij}$, respectively. Pictorially, $p_{ij}$'s and $q_{ij}$'s are denoted by ◎, $z_{ij}$'s and $d_{ij}$'s by ○, and transitions by −.

For a BM linking $C_i$ and $C_{i+1}$, place $p_{i(b[i])}$ is used to model the outgoing buffer for $C_i$ and $p_{(i+1)0}$ the incoming buffer for $C_{i+1}$. Physically, $p_{i(b[i])}$ and $p_{(i+1)0}$ are for the same BM. One uses two places to model the BM since it serves for both $C_i$ and $C_{i+1}$. One needs to configure a minimal number of spaces in a BM such that a one-wafer cyclic schedule can be obtained to reach the lower bound of cycle time. Hence, in modeling a BM, one assumes that a BM has two spaces, leading to $\Gamma(p_{i(b[i])}) = \Gamma(p_{(i+1)0}) = 2$. When the system is scheduled, for a BM, if at any time, there is only one token, a space is configured for this BM. However, if for some time, there are two tokens in a BM, two spaces are configured for this BM. Then, $p_{i(b[i])}$, $q_{i(b[i])}$, $z_{i(b[i])}$, $d_{i(b[i])}$, $t_{i(b[i])}$ and $u_{i(b[i])}$ are used to model Step $p_{i(b[i])}$ for $C_i$, while $p_{(i+1)0}$, $q_{(i+1)0}$, $z_{(i+1)0}$, $d_{(i+1)0}$, $t_{(i+1)0}$ and $u_{(i+1)0}$ are used to model Step 0 for $C_{i+1}$. In this way, the PN model for a BM is obtained as shown in FIG. 3.

Figure 3:
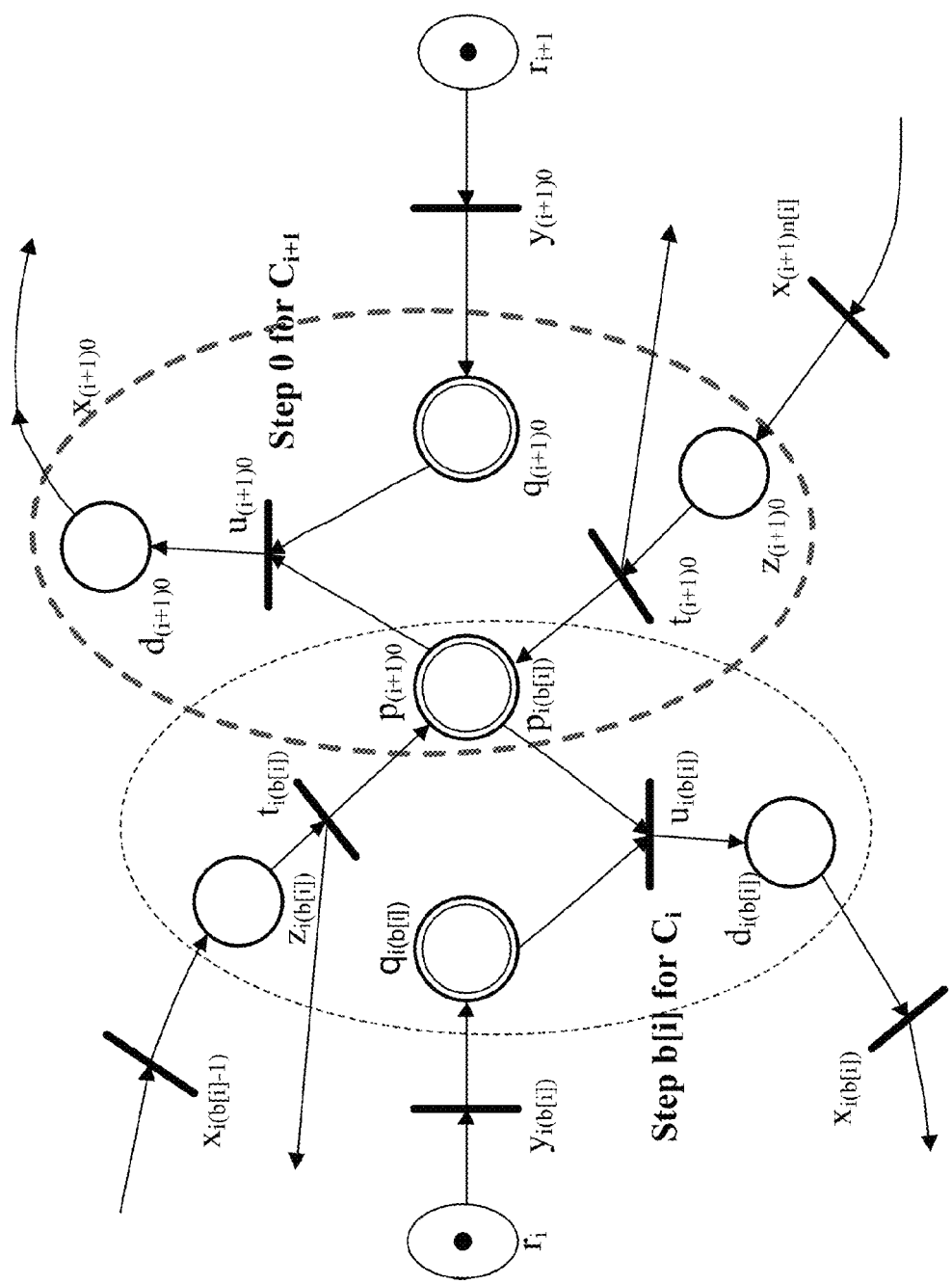
FIG. 3 depicts a PN model for a BM.

In the PN model shown in FIG. 3, $p_{i(b[i])}$ ($p_{(i+1)0}$) has two output transitions $u_{i(b[i])}$ and $u_{(i+1)0}$, leading to a conflict. Notice that when a token enters $p_{i(b[i])}$ by firing $t_{i(b[i])}$, it should enable $u_{(i+1)0}$, while a token enters $p_{(i+1)0}$ by firing $t_{(i+1)0}$, it should enable $u_{i(b[i])}$. To describe and resolve such a conflict, colors are introduced into the PN model as follows.

Definition 2.1: Transition $t_i$ has a unique color $\Omega(t_i) = \{c_i\}$ and a token in $p \in \bullet t_i$ enabling $t_i$ has color $\{c_i\}$ as $t_i$ has.

According to Definition 2.1, $u_{i(b[i])}$ and $u_{(i+1)0}$ have colors $c_{i(b[i])}$ and $c_{(i+1)0}$, respectively. When a token enters $p_{i(b[i])}$ by firing $t_{i(b[i])}$ has color $c_{(i+1)0}$, while a token enters $p_{(i+1)0}$ by firing $t_{(i+1)0}$ has color $c_{i(b[i])}$. Then, according to the transition enabling and firing rules, the PN model is made conflict-free.

Figure 4:
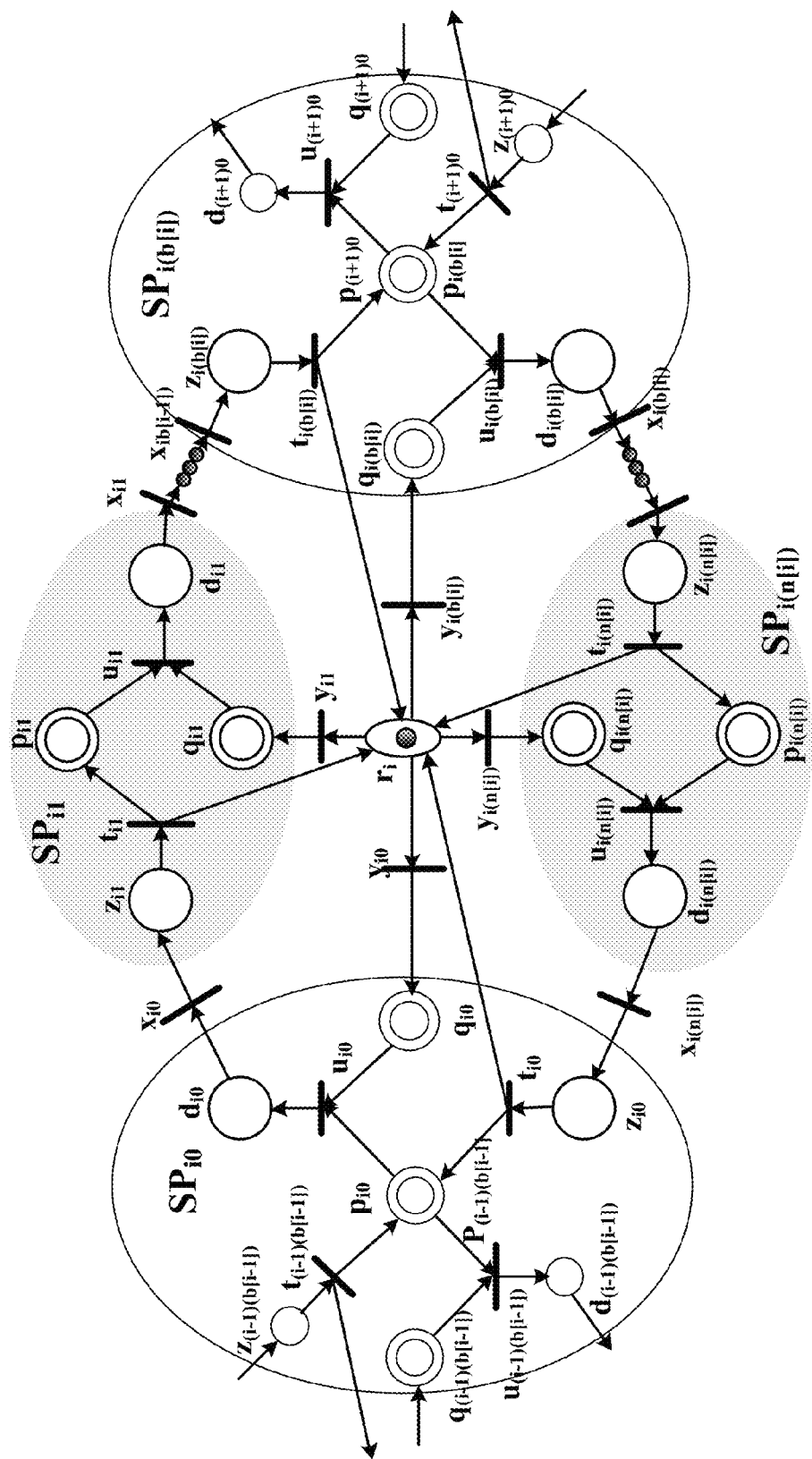
FIG. 4 depicts PN model for tool $C_i$.

With the PN models for steps and BMs, one can present the PN model for $C_i$, $i \in \mathbb{N}_{K-1} \setminus \{1\}$, as shown in FIG. 4. Place $r_i$ with $\Gamma(r_i) = 1$ models robot $R_i$ and denoted by ○. A token in $r_i$ indicates that the robot is available. Transition $y_{ij}$ together with arcs $(r_i, y_{ij})$ and $(y_{ij}, q_{ij})$ models $R_i$'s moving from Steps j+2 to j (or from Step 0 if j=n[i]−1, or from Step 1 if j=n[i]) without holding a wafer. Transition $x_{ij}$ together with arcs $(d_{ij}, x_{ij})$ and $(x_{ij}, z_{ij+1})$ models $R_i$'s moving from Steps j to j+1 (or to Step 0 if j=n[i]) and $(x_{ij}, z_{ij+1})$ is replaced by $(x_{ij}, z_{i0})$ with a wafer held. In this way, the PN model for $C_i$, $i \in \mathbb{N}_{K-1} \setminus \{1\}$, is obtained as shown in FIG. 4. Since the loadlocks denoted by $SP_{10}$ in $C_1$ are the incoming buffer but not shared with any other individual tool, replacing the PN model for the incoming buffer in FIG. 4 by the model for $SP_{10}$, one can obtain the PN model for $C_1$. Similarly, replacing the PN model for the outgoing buffer in FIG. 4 by the model for $SP_{Kj}$, one has the PN model for $C_K$.

With the structure of the PN model built, one can set initial marking $M_0$. By assumption that there are always wafers to be processed and the loadlocks can hold all wafers in processing, one sets $M_0(p_{10}) = n$. Since the K-cluster tool addressed here is process-dominant, or its bottleneck cluster tool is process-bound, at the steady state, if there is a wafer in processing at every processing step, the maximum productivity is achieved. Thus, for $C_1$, one sets $M_0(p_{1j})=1$, $j\in\Omega_{n[1]}\backslash\{0, b[i], b[i]-1\}$; $M_0(p_{1j})=0$, $j\in\{b[1], b[1]-1\}$; $M_0(z_{1j})=0$, $j\in\Omega_{n[1]}\backslash\{b[1]\}$; $M_0(z_{1(b[1])})=1$; $M_0(d_{ij})=0$, $j\in\Omega_{n[1]}$; $M_0(q_{1j})=0$, $j\in\Omega_{n[1]}$; and $M_0(r_1)=0$. By this setting, $R_1$ is at Step $b[1]$ ready for loading a wafer into $SP_{1(b[1])}$. For $C_i$, $2\le i\le K$, one sets $M_0(p_{ij})=1, i\in\mathbb{N}_K\backslash\{1\}$ and $j\in\Omega_{n[i]}\backslash\{0, 1, b[i]\}$; $M_0(p_{ij})=0$, $i\in\mathbb{N}_{k-1}\backslash\{1\}$ and $j\in\{0, 1, b[i]\}$; $M_0(p_{K0})=M_0(p_{K1})=0$; $M_0(z_{ij})=M_0(d_{ij})=0$, $i\in\mathbb{N}_K\backslash\{1\}$ and $j\in\Omega_{n[i]}$; $M_0(q_{ij})=0$, $i\in\mathbb{N}_K\backslash\{1\}$ and $j\in\mathbb{N}_{n[i]}\backslash\{0\}$; $M_0(q_{i0})=1$, $i\in\mathbb{N}_K\backslash\{1\}$; and $M_0(r_i)=0$, $i\in\mathbb{N}_K\backslash\{1\}$. By this setting, $R_i$ in $C_i$ is at Step 0 for unloading a wafer from $SP_{i0}$.

According to the transition enabling and firing rules, transition $t_i$ is enabled if there is a token with color $c_i$ in $\cdot t_i$ (process-enabled) and there is at least a free space in $t_i \cdot$ (resource-enabled). According to the rules, for $C_i$ at $M_0$, assume that transition firing sequence $\langle y_{i1} \to u_{i1} \to x_{i1} \rangle$ is performed such that a token enters $z_{i2}$. At this state, $t_{i2}$ is the only process-enabled transition, but it is not resource-enabled, since $M_0(p_{i2})=\Gamma(p_{i2})=1$. In other words, the system is deadlocked. To make it deadlock-free, a control policy is introduced into the model such that the model becomes a controlled PN [Wu, 1999]. For a controlled PN, a process and resource-enabled transition can fire only it is also control-enabled. Based on [Wu et al., 2008a], for the above developed PN, all $y_{ij}$'s are controlled and the control policy is defined as follows.

Definition 2.2: At marking M, transition $y_{ij}$, $i\in\mathbb{N}_K$, $j\in\Omega_{n[i]}\backslash\{n[i], b[i]-1\}$, is said to be control-enabled if $M(p_{i(j+1)})=0$; $y_{i(n[i])}$, $i\in\mathbb{N}_K$, is said to be control-enabled if $t_{i1}$ has just been fired; $y_{i(b[i-1])}$, $i\in\mathbb{N}_{K-1}$, is said to be control-enabled if $t_{i(b[i+1])}$ has just been fired.

It follows from [Wu et al., 2008a] that, by the control policy given in Definition 2.2, a single-arm cluster tool is deadlock-free. It is easy to verify that the PN model for a K-cluster tool is deadlock-free if the control policy given in Definition 2.2 is applied.

By assumption, a K-cluster tool is process-dominant, and a backward scheduling strategy for each individual tool is optimal. Then, with a backward scheduling strategy being applied, starting from $M_0$, the PN can evolve as follows. $R_1$ in $C_1$ loads a wafer into $p_{1(b[1])}$ by firing $t_{1(b[1])}$. Then, $R_1$ moves to $p_{1(b[1]-2)}$ for firing $u_{1(b[i]-2)}$. After firing $t_{1(b[1])}$, $u_{20}$ fires immediately by $R_2$ in $C_2$ and a token is moved to $p_{21}$. $R_i$, $i\in\mathbb{N}_K\backslash\{1,2\}$, acts similarly. The transition firing process for the individual tools can be described as follows. For $C_1$, the transition firing sequence is $\langle t_{1(b[1])} \to y_{1(b[1]-2)} \to u_{1(b[1]-2)} \to x_{1(b[1]-2)} \to t_{1(b[1]-1)} \to \ldots \to y_{10} \to u_{10} \to x_{10} \to t_{11} \to y_{1(n[1])} \to u_{1(n[1])} \to x_{1(n[1])} \to t_{10} \to y_{1(n[1]-1)} \to u_{1(n[1]-1)} \to x_{1(n[1]-1)} \to t_{1(n[1])} \to \ldots \to y_{1(b[1])} \to u_{1(b[1])} \to x_{1(b[1])} \to t_{1(b[1]+1)} \to y_{1(b[1]-1)} \to u_{1(b[1]-1)} \to x_{1(b[1]-1)} \to t_{1(b[1])}$ again$\rangle$; for $C_i$, $i\in\mathbb{N}_{K-1}\backslash\{1\}$, $\langle u_{i0} \to x_{i0} \to t_{i1} \to y_{i(n[i])} \to u_{i(n[i])} \to x_{i(n[i])} \to t_{i0} \to y_{i(n[i]-1)} \to u_{i(n[i]-1)} \to x_{i(n[i]-1)} \to t_{i(n[i])} \to \ldots \to y_{i(b[i])} \to u_{i(b[i])} \to x_{i(b[i])} \to t_{i(b[i]+1)} \to y_{i(b[i]-1)} \to u_{i(b[i]-1)} \to x_{i(b[i]-1)} \to t_{i(b[i])} \to \ldots \to y_{i0} \to u_{i0}$ again$\rangle$; and for $C_K$, $\langle u_{K0} \to x_{K0} \to t_{K1} \to y_{K(n[K])} \to u_{K(n[K])} \to x_{K(n[K])} \to t_{K0} \to y_{K(n[K]-1)} \to u_{K(n[K]-1)} \to x_{K(n[K]-1)} \to t_{K(n[K])} \to \ldots \to y_{K0} \to u_{K0}$ again$\rangle$. In this process, each time after $t_{i(b[i])}$, $i\in\mathbb{N}_{K-1}$, fires, $u_{(i+1)0}$ can fire, and after $t_{(i+1)0}$ fires, $u_{i(b[i])}$ can fire. In this way, the system can keep working. The key is how to coordinate the firing of $t_{i(b[i])}$, $u_{(i+1)0}$, $t_{(i+1)0}$, and $u_{i(b[i])}$, $i\in\mathbb{N}_{K-1}$.

A K-cluster tool may start from its idle state at which there is no wafer being processed. This state can be modeled by using virtual tokens denoted by $V_0$. Assume that, at $M_0$, every token in the PN model is a virtual token $V_0$. Then, the PN model evolves according to the transition enabling and firing rules such that whenever $u_{10}$ fires, a token representing a real wafer is delivered into the system. In this way, when all $V_0$ tokens are removed from the model, the initial transient process ends and a steady state is reached. This implies that, by doing so, the PN model describes not only the steady state but also the idle state and initial transient process. Similarly, it can also describe the final transient process.

A.3 Modeling Activity Time

To describe the temporal properties of a K-cluster tool's PN model, time is associated with both places and transitions. When time $\zeta$ is associated with transition t, t's firing should last for $\zeta$ time units; while it is associated with place p, a token should stay in p for at least $\zeta$ time units before it can enable its output transition. As pointed out by Kim et al., [2003], the time taken for $R_i$ to load/unload a wafer into/from a PM, loadlock, and BM is same, and is denoted by $\lambda_i$. Similarly, the time taken for $R_i$ to move among PMs, loadlocks, and BMs is also same no matter whether $R_i$ holds a wafer or not, and is denoted by $\mu_i$. The time taken for processing a wafer at step j in $C_i$ is $\alpha_{ij}$. Let $\omega_{ij}$ and $\tau_{ij}$ denote $R_i$'s waiting time in $q_{ij}$ and the wafer sojourn time in a PM at Step j in $C_i$, respectively. The time duration for transitions and places are summarized in Table I.

TABLE I

Time duration for transitions and places

| Symbol | Transition or place | Actions | Time duration |
|---|---|---|---|
| $\lambda_i$ | $t_{ij}$ | $R_i$ loads a wafer into $p_{ij}$, $i \in \mathbf{N}_K$, $j \in \Omega_{n[i]}$ | $\lambda_i$ |
| | $u_{ij}$ | $R_i$ unloads a wafer from $p_{ij}$, $i \in \mathbf{N}_K$, $j \in \Omega_{n[i]}$ | |
| $\mu_i$ | $x_{ij}$ | $R_i$ moves from $p_{ij}$ to $p_{i(j+1)}$, $i \in \mathbf{N}_K$, $j \in \Omega_{n[i]-1}$ (or from $p_{i(n[i])}$ to $p_{i0}$, $i \in \mathbf{N}_K$, $j = n[i]$) | $\mu_i$ |
| | $y_{ij}$ | $R_i$ moves from $p_{i(j+2)}$ to $p_{ij}$, $i \in \mathbf{N}_K$, $j \in \Omega_{n[i]}$ (or from $p_{i0}$ to $p_{i(n[i]-1)}$, if $i \in \mathbf{N}_K$ and $j = n[i] - 1$, or from $p_{i1}$ to $p_{i(n[i])}$, if $i \in \mathbf{N}_K$ and $j = n[i]$) | |
| $\alpha_{ij}$ | $p_{ij}$ | A wafer being processing in $p_{ij}$, $i \in \mathbf{N}_K$, $j \in \Omega_{n[i]}$ | $\alpha_{ij}$ |
| $\tau_{ij}$ | $p_{ij}$ | Wafer sojourn time in $p_{ij}$, $i \in \mathbf{N}_K$, $j \in \Omega_{n[i]}$ | $\tau_{ij}$ |
| $\omega_{ij}$ | $q_{ij}$ | $R_i$ waits before it unloads a wafer from $p_{ij}$, $i \in \mathbf{N}_K$, $j \in \Omega_{n[i]}$ | $[0, \infty)$ |
| | $z_{ij}$ or $d_{ij}$ | No robot activity related to it | 0 |

Up to now, one completes the modeling of a K-cluster tool. Based on the PN model, one discusses how to schedule an individual cluster tool next.

B. Scheduling of Individual Cluster Tools

To schedule a K-cluster tool, one needs to schedule its individual cluster tools and, at the same time, coordinate the activities of multiple robots. If all the individual tools are scheduled to be operated in a paced way and, at the same time, each tool can operate in an independent way, a cyclic schedule is obtained for a K-cluster tool. Based on this concept, one next discusses the scheduling problem of individual cluster tools.

For cluster tool $C_i$, based on the PN model, one first analyzes the time taken for completing a wafer at Step j, $j \in \Omega_{n[i]}$. According to the PN model, to complete a wafer at Step j, the following transition firing sequence is performed: $\sigma_1 = \langle$ firing $u_{ij}$(with time $\lambda_i$)$\rightarrow x_{ij}(\mu_i) \rightarrow t_{i(j+1)}(\lambda_i) \rightarrow y_{i(j-1)}(\mu_i) \rightarrow R_i$ waiting in $q_{i(j-1)}(\omega_{i(j-1)}) \rightarrow u_{i(j-1)}(\lambda_i) \rightarrow x_{i(j-1)}(\mu_i) \rightarrow t_{ij}(\lambda_i) \rightarrow$ processing a wafer in $p_{ij}(\alpha_{ij}) \rightarrow u_{ij}(\lambda_i)$ again$\rangle$. In this process, if j=n[i], it requires to replace $\langle t_{i(j+1)}(\lambda_i) \rangle$ by $\langle t_{i0}(\lambda_i) \rangle$ without changing the time taken.

If j=b[i] for a BM, let $\xi_1$ be the time point when firing $t_{i(b[i])}$ ends and $\xi_2$ be the time point when firing $u_{i(b[i])}$ starts. Although, for a BM, there is no wafer processing function and the wafers (tokens) delivered by $t_{i(b[i])}$ and $u_{i(b[i])}$ are different, for a scheduling purpose, one concerns only the time taken. Hence, one can treat $\alpha_{i(b[i])} = \xi_2 - \xi_1$ as a virtual wafer processing time for a BM, which is consistent with $\alpha_{ij}$ for a wafer processing step.

Similarly, if j=0, let $\rho_1$ be the time point when firing $t_{i0}$ ends and $\rho_2$ the time point when firing $u_{i0}$ starts. Then, $\alpha_{i0} = \rho_2 - \rho_1$ can be treated as the virtual wafer processing time for Step 0. Thus, the time taken for completing a wafer at Step j is $$\zeta_{ij} = \alpha_{ij} + 4\lambda_i + 3\mu_i + \omega_{i(j-1)}, i \in \mathbb{N}_K \text{ and } j \in \mathbb{N}_{n[i]} \quad (3.1)$$

$$\zeta_{i0} = \alpha_{i0} + 4\lambda_i + 3\mu_i + \omega_{i(n[i])} \quad (3.2)$$

Notice that Step $SP_{10}$ is for the loadlocks. By assumption, there are always wafers ready to be processed. Hence, after firing $t_{10}$, $u_{10}$ can fire immediately, leading to $\alpha_{10}=0$. Also, $\alpha_{i(b[i])}$ and $\alpha_{i0}$ can be zero, dependent on a schedule for $C_i$ and a K-cluster tool.

If $R_i$' waiting time is removed from (3.1) and (3.2), then the shortest time for completing a wafer at step j is $$\zeta_{ij} = \alpha_{ij} + 4\lambda_i + 3\mu_i, i \in \mathbb{N}_K \text{ and } j \in \Omega_{n[i]} \quad (3.3)$$

To coordinate the behavior of the steps in an individual tool, the tool may be scheduled such that after a wafer is processed in a PM at Step j, the wafer stays at the PM for some time, i.e., $\tau_{ij} \geq \alpha_{ij}$. In (3.1) and (3.2), replace $\alpha_{ij}$ by $\tau_{ij}$, one has $$\eta_{ij} = \tau_{ij} + 4\lambda_i + 3\mu_i + \omega_{i(j-1)}, i \in \mathbb{N}_K \text{ and } j \in \mathbb{N}_{n[i]} \quad (3.4)$$

$$\eta_{i0} = \tau_{i0} + 4\lambda_i + 3\mu_i + \omega_{i(n[i])} \quad (3.5)$$

Then, one needs to analyze $R_i$'s cycle time in $C_i$. In this cycle, $R_i$ performs activity sequence $\sigma_2 = \langle$ firing $y_{i(n[i])}(\mu_i) \rightarrow$ waiting in $q_{i(n[i])}(\omega_{i(n[i])}) \rightarrow u_{n[i]}(\lambda_i) \rightarrow x_{i(n[i])}(\mu_i) \rightarrow t_{i0}(\lambda_i) \rightarrow \ldots \rightarrow y_{i(j-1)}(\mu_i) \rightarrow$ waiting in $q_{i(j-1)}(\omega_{i(j-1)}) \rightarrow u_{i(j-1)}(\lambda_i) \rightarrow x_{i(j-1)}(\mu_i) \rightarrow t_{ij}(\lambda_i) \rightarrow y_{i(j-2)}(\mu_i) \rightarrow$ waiting in $q_{i(j-2)}(\omega_{i(j-2)}) \rightarrow u_{i(j-2)}(\lambda_i) \rightarrow x_{i(j-2)}(\mu_i) \rightarrow t_{i(j-1)}(\lambda_i) \rightarrow \ldots \rightarrow y_{i0}(\mu_i) \rightarrow$ waiting in $q_{i0}(\omega_{i0}) \rightarrow u_{i0}(\lambda_i) \rightarrow x_{i0}(\mu_i) \rightarrow t_{i1}(\lambda_i) \rightarrow y_{i(n[i])}(\mu_i)$ again$\rangle$. During this process, all the transitions fire only once and there is a waiting time in $q_{ij}$. Since there are (n[i]+1) $y_{ij}$'s, $u_{ij}$'s, $x_{ij}$'s, $t_{ij}$'s, and $q_{ij}$'s, the cycle time for $R_i$ in $C_i$ can be calculated as $$\psi_i = 2(n[i]+1)(\lambda_i + \mu_i) + \Sigma_{j=0}^{n[i]} \omega_{ij} = \psi_{i1} + \psi_{i2}, i \in \mathbb{N}_K, \quad (3.6)$$

where $\psi_{i1} = 2(n[i]+1)(\lambda_i + \mu_i)$ is $R_i$'s task time in a cycle and is constant, while $\psi_{i2} = \Sigma_{j=0}^{n[i]} \omega_{ij}$ is $R_i$'s waiting time in a cycle.

Let $\pi_i = \max\{\zeta_{i0}, \zeta_{i1}, \ldots, \zeta_{i(n[i])}, \psi_{i1}\}$ denote the fundamental period (FP) [Perkinson et al., 1994; and Venkatesh et al., 1997] for $C_i$. If $\pi_i = \max\{\zeta_{i0}, \zeta_{i1}, \ldots, \zeta_{i(n[i])}\}$, $C_i$ is process-bound, otherwise it is transport-bound. Since the steps in $C_i$ operate in a serial way, the productivity for each step should be identical, or the time taken for completing a wafer at each step in $C_i$ should be same. Let $\eta_i$ be the time taken for $C_i$ to complete a wafer. Then, one has $$\eta_i = \eta_{i0} = \eta_{i1} = \ldots = \eta_{i(n[i])} \quad (3.7)$$

It indicates that, at a steady state, all the steps in $C_i$ have the same cycle time. By examining $\sigma_1$ and $\sigma_2$, one can conclude that $R_i$'s cycle time is same as the cycle time for each step. Hence, one has $$\psi_i = \eta_i = \eta_{i0} = \eta_{i1} = \ldots = \eta_{i(n[i])} \quad (3.8)$$

It follows from (3.6) that $R_i$'s cycle time consists of $\psi_{i1}$ and $\psi_{i2}$, where $\psi_{i1}$ is a known constant and $\psi_{i2}$ is the sum of $\omega_{ij}$'s that are to be determined by a schedule. Thus, to schedule individual tools is to determine $\omega_{ij}$'s, or the scheduling problem for the individual tools is parameterized by $\omega_{ij}$'s. With these results, one discusses how to configure the spaces for the BMs such that a one-wafer cyclic schedule is found to reach the lower bound of cycle time for a K-cluster tool next.

C. Scheduling K-Cluster Tool

Let $\pi = \max\{\pi_1, \pi_2, \ldots, \pi_K\}$ and assume $\pi = \pi_h$, the FP of $C_h$. This implies that $C_h$ is the bottleneck tool in a K-cluster tool. Let $\eta$ be the cycle time of a cyclic schedule for a K-cluster tool. Then, one has $\eta \geq \pi$ [Zhu et al., 2013; and Yang et al., 2014], i.e., $\pi$ is the lower bound of cycle time of any cyclic schedule for a K-cluster tool. Let $\eta_i$ be the cycle time of a one-wafer cyclic schedule for $C_i$, $i \in \mathbb{N}_K$. To find a one-wafer cyclic schedule with cycle time $\eta$ for a K-cluster tool, one has the following result.

Proposition 4.1: To obtain a cyclic schedule for a K-cluster tool with cycle time $\eta$, the cycle time of a cyclic schedule for its individual tool $C_i$, $i \in \mathbb{N}_K$, should be equal to $\eta$, or $$\eta_1 = \eta_2 = \ldots = \eta_K = \eta \quad (4.1)$$

Proof: With the developed PN model for a BM linking $C_i$ and $C_{i+1}$, at marking M, for $C_i$, one assumes that $t_{ib[i]}$ fires at time $\xi_1$ such that a token enters $p_{(i)(b[i])}$ ($p_{(i+1)0}$) at $\xi_2 = \xi_1 + \lambda_i$. Further, assume that, at $\xi_2$, there is a token in $q_{(i+1)0}$. By the transition enabling and firing rules, after firing $t_{ib[i]}$, $u_{(i+1)0}$ is enabled and it fires at $\xi_2$. Then, in $C_i$, after a cycle, $t_{ib[i]}$ fires again such that another token enters $p_{i(b[i])}$ ($p_{(i+1)0}$) at $\xi_3 = \xi_2 + \eta_i$. After $\xi_3$, for $C_{i+1}$, when a token enters $q_{(i+1)0}$, $u_{(i+1)0}$ can fire again at only $\xi_4 \geq \xi_3 = \xi_2 + \eta_i$. Thus, one has $\eta_{i+1} = \xi_4 - \xi_2 \geq \xi_3 - \xi_2 = (\xi_2 + \eta_i) - \xi_2 = \eta_i$, or $\eta_{i+1} \geq \eta_i$. In the same way, one can show that $\eta_i \geq \eta_{i+1}$. This implies that $\eta_i = \eta_{i+1}$. Hence, one has $\eta_1 = \eta_2 = \ldots = \eta_K$. Since the cycle time for the K-cluster tool is equal to that of $C_1$, one has $\eta_1 = \eta_2 = \ldots = \eta_K = \eta$, or the proposition holds.

To maximize the productivity of a K-cluster tool, it is desired that it is scheduled such that the lower bound cycle time $\pi$ is reached. For easy implementation, a one-wafer cyclic schedule is preferred. It follows from Proposition 4.1 that, to reach such a goal, a K-cluster tool should be scheduled such that $$\eta_1 = \eta_2 = \ldots = \eta_K = \eta = \pi = \pi_h \quad (4.2)$$

It follows from Zhu et al., [2013], for a K-cluster tool, there may be no cyclic schedule such that the lower bound cycle time is reached. A one-wafer cyclic schedule with the lower bound of cycle time may be found by increasing buffer spaces in BMs. It is shown that, with two buffer spaces in each BM, a one-wafer cyclic schedule with the lower bound of cycle can be always found [Yang et al., 2014]. Then a question is whether one needs two buffer spaces in each BM? One answers this question by finding a one-wafer cyclic schedule with the lower bound of cycle time with minimal buffer space configuration in this section.

C.1 Scheduling Analysis

According to the above analysis, to reach the lower bound of cycle time, for $C_i$, $i \in \mathbb{N}_K$, a one-wafer cyclic schedule should be found such that its cycle time is $\pi$. Assume that such a schedule is found by using the method given in the last section for $C_i$, $i \in \mathbb{N}_K$, such that the time for firing $t_{i0}$, $u_{i0}$, $t_{i(b[i])}$, and $u_{i(b[i])}$ is determined. If, at a time, any of these transitions should fire as scheduled, it is enabled and can fire, then every individual tool can operate independently. In this way, a one-wafer cyclic schedule with cycle time $\pi$ is obtained for a K-cluster tool. Since a K-cluster tool addressed in the present invention is process-dominant, one has $\pi = \pi_h$ and $\pi \geq \pi_i$, and $\psi_{i2} = \pi - \psi_{i1} \geq 0$, $i \in \mathbb{N}_K$. This implies that if $C_i$, $i \in \mathbb{N}_K \setminus \{h\}$, is transport-bound, it is not meaningful to reduce the cycle time by reducing the number of wafers being concurrently processed in the tool. Hence, a backward scheduling strategy can be applied for any $C_i$, $i \in \mathbb{N}_K$. Then, the key is how to schedule individual tool $C_i$, $i \in \mathbb{N}_K$, by determining $R_i$'s waiting time $\omega_{ij}$'s such that $\psi_{i2} = \pi - \psi_{i1}$. To obtain a one-wafer cyclic schedule for $C_i$, $i \in \mathbb{N}_K$, such that its cycle time is $\pi$, according to the discussion in the last section, one has $\eta_{ij} = \pi = \pi_h$, $j \in \Omega_{n[i]}$. Then, it follows from (4.2) that one has $$\eta_{ij} = \eta_{(i+1)j} = \pi = \pi_h, i \in \mathbb{N}_{K-1}, j \in \Omega_{n[i]}, \text{ and } f \in \Omega_{n[i+1]} \quad (4.3)$$

By (4.3), all the individual tools can be operated in a paced way. Then, the key is to coordinate multiple robots such that when any of $t_{i0}$, $u_{i0}$, $t_{i(b[i])}$, and $u_{i(b[i])}$, $i \in \mathbb{N}_K$, should fire as scheduled, it is enabled. To do so, one needs to analyze the dynamic behavior of a K-cluster tool.

Theorem 4.1: For a process-dominant K-cluster tool, a one-wafer cyclic schedule can be found with cycle time $\pi$ by determining the robot waiting time $\omega_{ij}$'s and $\omega_{(i+1)j}$'s for $C_i$, $i \in \mathbb{N}_{K-1}$, if and only if two BMs linking $C_{i-1}$ and $C_i$, and $C_i$ and $C_{i+1}$ have one buffer space, and the following conditions are satisfied.

$$\tau_{i(b[i])} \geq 4\lambda_{i+1} + 3\mu_{i+1} + \omega_{(i+1)(n[i+1])} \quad (4.4)$$

$$\tau_{(i+1)0} \geq 4\lambda_i + 3\mu_i + \omega_{i(b[i]-1)} \quad (4.5)$$

Proof Necessity: Consider the BM linking $C_i$ and $C_{i+1}$ denoted by Step b[i] in $C_i$, $i \in \mathbb{N}_{K-1}$. By (3.4), (3.5), and (4.3), the cycle time for this step should be scheduled to be $\eta_{i(b[i])} = \pi = \tau_{i(b[i])} + 4\lambda_i + 3\mu_i + \omega_{i(b[i]-1)}$ such that the wafer sojourn time $\tau_{i(b[i])} = \pi - (4\lambda_i + 3\mu_i + \omega_{i(b[i]-1)})$. With the PN model shown in FIG. 3, firing $t_{i(b[i])}$ loads a wafer into $p_{i(b[i])}$ $(p_{(i+1)0})$. Let $\phi_1$ denote the time point when firing $t_{i(b[i])}$ ends. Assume that, after firing $t_{i(b[i])}$, the token in $p_{i(b[i])}$ $(p_{(i+1)0})$ is delivered immediately to $C_{i+1}$ at $\phi_1$ by firing $u_{(i+1)0}$. Then, $R_{i+1}$ in $C_{i+1}$ performs transition firing sequence $\sigma_1 =$ ( firing $u_{(i+1)0}(\lambda_{i+1}) \to x_{(i+1)0}(\mu_{i+1}) \to t_{(i+1)1}(\lambda_{i+1}) \to y_{(i+1)(n[i+1])}$ $(\mu_{i+1}) \to$ waiting in $q_{(i+1)(n[i+1])}(\omega_{(i+1)n[i+1]}) \to u_{(i+1)(n[i+1])}$ $(\lambda_{i+1}) \to x_{(i+1)(n[i+1])}(\mu_{i+1}) \to t_{(i+1)0}(\lambda_{i+1})$ ) such that a new token in $C_{i+1}$ is loaded into $p_{(i+1)0}$ $(p_{i(b[i])})$ by firing $t_{(i+1)0}$ such that $u_{i(b[i])}$ is enabled. Let $\phi_2$ be the time point when a wafer is loaded into $p_{(i+1)0}$ $(p_{i(b[i])})$ (the end of firing $t_{(i+1)0}$). Let $\Theta = (\phi_2 - \phi_1) + 4\lambda_i + 3\mu_i + \omega_{i(b[i]-1)}$. Then, the cycle time for Step b[i] in $C_i$ must be greater or equal to $\Theta$. By $\sigma_1$, one has $\phi_2 - \phi_1 = 4\lambda_{i+1} + 3\mu_{i+1} + \omega_{(i+1)n[i+1]}$. Further, assume that $\tau_{i(b[i])} \geq 4\lambda_{i+1} + 3\mu_{i+1} + \omega_{(i+1)(n[i+1])}$ does not hold, or $\phi_2 - \phi_1 = 4\lambda_{i+1} + 3\mu_{i+1} + \omega_{(i+1)(n[i+1])} > \tau_{i(b[i])}$. This implies that $\Theta = (\phi_2 - \phi_1) + 4\lambda_i + 3\mu_i + \omega_{i(b[i]-1)} > \tau_{i(b[i])} + 4\lambda_i + 3\mu_i + \omega_{i(b[i]-1)} = \pi$, which contradicts that the cycle time of $C_i$ is $\pi$. Hence, (4.4) is necessary. Similarly, one can show that $\tau_{(i+1)0} \geq 4\lambda_i + 3\mu_i + \omega_{i(b[i]-1)}$ is necessary to make $t_{i(b[i])}$ enabled when it is scheduled to fire. Also, consider the BM linking $C_{i-1}$ and $C_i$, one can show the necessity of (4.4) and (4.5). Notice that when one shows the necessity of (4.4) and (4.5), one requires that there be a space in $p_{(i+1)0}$ $(p_{i(b[i])})$, otherwise it is not possible. Hence, the buffer space is also necessary.

Sufficiency: With the PN model shown in FIG. 3, one examines the BM linking $C_i$ and $C_{i+1}$ denoted by Step b[i] in $C_i$, $i \in \mathbb{N}_{K-1}$. With $\pi$ being the cycle time, by the scheduling method given in the last section, a one-wafer cyclic schedule is obtained such that $\pi = \tau_{i(b[i])} + 4\lambda_i + 3\mu_i + \omega_{i(b[i]-1)}$. Let $\phi_3$ be the time point when firing $t_{i(b[i])}$ ends such that a wafer is loaded into $p_{i(b[i])}$ $(p_{(i+1)0})$. At the same time, $C_{i+1}$ is scheduled such that $u_{(i+1)0}$ starts to fire at $\phi_3$ and then $\sigma_1$ is performed. Let $\phi_4$ denote the time point when firing $t_{(i+1)0}$ ends and a wafer is loaded into $p_{(i+1)0}$ $(p_{i(b[i])})$ such that $u_{i(b[i])}$ is enabled. Thus, one has $\phi_4 - \phi_3 = 4\lambda_{i+1} + 3\mu_{i+1} + \omega_{(i+1)(n[i+1])}$. By (4.4), one has $\tau_{i(b[i])} \geq 4\lambda_{i+1} + 3\mu_{i+1} + \omega_{(i+1)(n[i+1])}$. This implies that $u_{i(b[i])}$ is scheduled to start firing at $\phi_5$ with $\phi_5 - \phi_3 = \tau_{i(b[i])}$. Hence, one has $\phi_5 - \phi_3 = \tau_{i(b[i])} \geq 4\lambda_{i+1} + 3\mu_{i+1} + \omega_{(i+1)(n[i+1])} = \phi_4 - \phi_3$. In other words, when $u_{i(b[i])}$ is scheduled to fire, there is a token in $p_{(i+1)0}$ $(p_{i(b[i])})$, or $u_{i(b[i])}$ is enabled. Then, after firing $u_{i(b[i])}$, when $t_{i(b[i])}$ is scheduled to fire, $p_{(i+1)0}$ $(p_{i(b[i])})$ is empty since $\tau_{(i+1)0} \geq 4\lambda_i + 3\mu_i + \omega_{i(b[i]-1)}$. This implies that $t_{i(b[i])}$ is enabled. Similarly, by examining Step 0 in $C_i$, one can show that, if (4.4) and (4.5) hold, both $u_{i0}$ and $t_{i0}$ are enabled whenever they are scheduled to fire. Notice that, in the above discussed process, there is at most one token $p_{(i+1)0}$ $(p_{i(b[i])})$, or one buffer space is sufficient.

In Theorem 4.1, to find a one-wafer cyclic schedule for $C_i$ with cycle time $\pi$ such that $C_i$ can operate independently, one requires that both (4.4) and (4.5) hold. However, by examining the BM linking $C_i$ and $C_{i+1}$, $i \in \mathbb{N}_{K-1}$, one can show that if one of the conditions (4.4) and (4.5) holds, the other holds too. One has the following corollary.

Corollary 4.1: For $C_i$ and $C_{i+1}$ linking by a BM, if Condition (4.4) in Theorem 4.1 holds, then (4.5) holds; and vice versa.

Proof: Assume that $\tau_{i(b[i])} \geq 4\lambda_{i+1} + 3\mu_{i+1} + \omega_{(i+1)(n[i+1])}$ holds. For Step b[i] in $C_i$, by (3.4), (3.5), and (4.3), one has $\pi = \tau_{i(b[i])} + 4\lambda_i + 3\mu_i + \omega_{i(b[i]-1)}$, thus leading to $\tau_{i(b[i])} = \pi - (4\lambda_i + 3\mu_i + \omega_{i(b[i]-1)}) \geq 4\lambda_{i+1} + 3\mu_{i+1} + \omega_{(i+1)(n[i+1])}$. For Step 0 in $C_{i+1}$, by (3.4), (3.5), and (4.3), one has $\pi = \tau_{(i+1)0} + 4\lambda_{i+1} + 3\mu_{i+1} + \omega_{(i+1)(n[i+1])}$, thus leading to $4\lambda_{i+1} + 3\mu_{i+1} + \omega_{(i+1)(n[i+1])} = \pi - \tau_{(i+1)0}$. Therefore, $\pi - (4\lambda_i + 3\mu_i + \omega_{i(b[i]-1)}) \geq 4\lambda_{i+1} + 3\mu_{i+1} + \omega_{(i+1)(n[i+1])} = \pi - \tau_{(i+1)0}$, leading to $\tau_{(i+1)0} \geq 4\lambda_i + 3\mu_i + \omega_{i(b[i]-1)}$. Similarly, if (4.5) holds, one can show that (4.4) holds.

It follows from Corollary 4.1 that, if one of conditions (4.4) and (4.5) holds, to find a one-wafer cyclic schedule with cycle time $\pi$ for $C_i$, one needs one buffer space in the BMs linking $C_{i-1}$ and $C_i$, and $C_i$ and $C_{i+1}$. However, Conditions (4.4) and (4.5) may not be satisfied for both BMs linking $C_{i-1}$ and $C_i$, and $C_i$ and $C_{i+1}$. By observing (4.4), if $\tau_{i(b[i])} < 4\lambda_{i+1} + 3\mu_{i+1}$, one has $\tau_{i(b[i])} < 4\lambda_{i+1} + 3\mu_{i+1} + \omega_{(i+1)(n[i+1])}$. Then, one has the following result.

Theorem 4.2: For a process-dominant K-cluster tool, a one-wafer cyclic schedule can be found with cycle time $\pi$ by determining the robot waiting time $\omega_{ij}$'s and $\omega_{(i+1)j}$'s for $C_i$, $i \in \mathbb{N}_{K-1}$, if the BM linking $C_{i-1}$ and $C_i$ has one buffer space, the BM linking $C_i$ and $C_{i+1}$ has two buffer spaces, and the following conditions are satisfied $$\tau_{(i-1)(b[i-1])} \geq 4\lambda_i + 3\mu_i + \omega_{i(n[i])} \quad (4.6)$$

$$\text{and } \tau_{i(b[i])} < 4\lambda_{i+1} + 3\mu_{i+1} \quad (4.7)$$

Proof: It follows from Theorem 4.1 that, if condition (4.6) is satisfied and there is one buffer space in the BM linking $C_{i-1}$ and $C_i$, $C_i$ can be scheduled with cycle time $\pi$ such that, whenever $t_{i0}$ and $u_{i0}$ are scheduled to fire, they are enabled and can fire. Then, one examines $t_{i(b[i])}$ and $u_{i(b[i])}$. With two buffer spaces in the BM linking $C_i$ and $C_{i+1}$, one assumes that at marking M, there is a token in $z_{i(b[i])}$ and a token in $p_{i(b[i])}$ ($p_{(i+1)0}$) with color $c_{i(b[i])}$, or it enables $u_{i(b[i])}$. At this marking, $K(p_{i(b[i])}) - M(p_{i(b[i])}) = 1$, or this is a free space in it such that $t_{i(b[i])}$ is enabled. Then, the system is scheduled as follows. Transition $t_{i(b[i])}$ fires and a token with color $c_{(i+1)0}$ is loaded into $p_{i(b[i])}$ ($p_{(i+1)0}$). Let $\phi_1$ be the time point when firing $t_{i(b[i])}$ ends. Notice that, at this time, there are two tokens with different colors in $p_{i(b[i])}$ ($p(_{i+1)0}$) simultaneously. After firing $t_{i(b[i])}$, $u_{(i+1)0}$ fires immediately at $\phi_1$. Also, after $\tau_{i(b[i])} = \pi - (4\lambda_i + 3\mu_i + \omega_{(i)(b[i]-1)})$ time units, $u_{i(b[i])}$ fires at time $\phi_2 = \phi_1 \tau_{i(b[i])} = \phi_1 + \pi - (4\lambda_i + 3\mu_i + \omega_{(i)(b[i]-1)})$ and a token is removed from $p_{i(b[i])}$ ($p(_{i+1)0}$). For $C_{i+1}$, after firing $u_{(i+1)0}$ at $\phi_1$, $\sigma_1$ is performed. Let $\phi_3$ be the time point when firing $t_{(i+1)0}$ ends. One has $\phi_3 = \phi_1 + 4\lambda_{i+1} + 3\mu_{i+1} + \omega_{(i+1)(n[i+1])}$. Since $\tau_{i(b[i])} < 4\lambda_{i+1} + 3\mu_{i+1}$, $\phi_2 = \phi_1 + \tau_{i(b[i])} < \phi_1 4\lambda_{i+1} + 3\mu_{i+1} < \phi_1 4\lambda_{i+1} + 3\mu_{i+1} \omega_{(i+1)(n[i+1])} = \phi_3$, or $\phi_2 < \phi_3$. It means that there is no conflict. At time $\phi_3$, there is a free space in $p_{i(b[i])}$ ($p_{(i+1)0}$) such that $t_{i(b[i])}$ can fire again as scheduled.

Theorem 4.2 shows that, if $\tau_{i(b[i])} < 4\lambda_{i+1} + 3\mu_{i+1}$, two buffer spaces in the BM linking $C_i$ and $C_{i+1}$ are sufficient. It follows from Theorem 4.1 that, if $\tau_{i(b[i])} < 4\lambda_{i+1} + 3\mu_{i+1}$, one buffer space in the BM linking $C_i$ and $C_{i+1}$ is not sufficient. Thus, one has the following corollary immediately.

Corollary 4.2: For a process-dominant K-cluster tool, if $\tau_{i(b[i])} < 4\lambda_{i+1} + 3\mu_{i+1}$, two buffer spaces in the BM linking $C_i$ and $C_{i+1}$ are necessary to find a one-wafer cyclic schedule with cycle time $\pi$ for $C_i$.

With cycle time being $\pi$, one has $\tau_{i(b[i])} = \pi - (4\lambda_i + 3\mu_i + \omega_{(i)(b[i]-1)})$. This means that $\tau_{i(b[i])}$ decreases as $\omega_{(i)(b[i]-1)}$ increases. It follows from Theorem 4.1 that, to obtain a one-wafer cyclic schedule with cycle time $\pi$ for a K-cluster tool, it is desired to schedule the individual tools such that $\tau_{i(b[i])}$ is as large as possible, i.e., $\omega_{(i)(b[i]-1)}$ is as small as possible. Since $\psi_{i2} = \pi - \psi_{i1} = \sum_{j=0}^{n[i]} \omega_{ij}$, if one sets $\omega_{i(n[i])} = \psi_{i2}$, one has $\omega_{(i)(b[i]-1)} = 0$ and $\tau_{i(b[i])} = \pi - (4\lambda_i + 3\mu_i)$ is maximized. One has the following result.

Theorem 4.3: For a process-dominant K-cluster tool, if $\tau_{i(b[i])} < 4\lambda_{i+1} + 3\mu_{i+1}$ and the BM linking $C_i$ and $C_{i+1}$ has two buffer spaces, by setting $\omega_{(i+1)(n[i+1])} = \psi_{(i+1)2}$, both $C_i$ and $C_{i+1}$ can be scheduled with cycle time $\pi$ such that $t_{i(b[i])}$, $u_{i(b[i])}$, $t_{(i+1)0}$, and $u_{(i+1)0}$ can fire whenever they are scheduled to fire.

Proof: Just as the proof of Theorem 4.2, the firing of $t_{i(b[i])}$ ends at $\phi_1$, $u_{i(b[i])}$ fires at time $\phi_2 = \phi_1 + \tau_{i(b[i])} = \phi_1 + \pi - (4\lambda_i + 3\mu_i + \omega_{(i)(b[i]-1)})$, and the firing of $t_{(i+1)0}$ ends at $\phi_3$. One has $\phi_2 = \phi_1 + \tau_{i(b[i])} < \phi_1 + 4\lambda_{i+1} + 3\mu_{i+1} < \phi_1 + 4\lambda_{i+1} + 3\mu_{i+1} + \psi_{(i+1)2} = \phi_3$, or $\phi_2 < \phi_3$. This implies that $t_{(i+1)0}$ can fire as scheduled. After firing $u_{i(b[i])}$ in $C_i$, $t_{i(b[i])}$ fires again and this firing ends at $\phi_4 = \phi_1 + \pi$ such that a token enabling $u_{(i+1)0}$ enters $p_{i(b[i])}$ ($p_{(i+1)0}$). Since $C_{i+1}$ is also scheduled with cycle time $\pi$, $u_{(i+1)0}$ is scheduled to fire again at $\phi_1 + \pi$. At this time there is already a token that enables $u_{(i+1)0}$ there. Thus, it can fire and the theorem holds.

By Theorem 4.3, if two buffer spaces should be configured for the BM linking $C_{i-1}$ and $C_i$, one can find a one-wafer schedule for $C_i$ with cycle time $\pi$ by setting $\omega_{i(n[i])} = \psi_{i2}$. By doing so, $\tau_{i(b[i])} = \pi - (4\lambda_i + 3\mu_i)$ is maximized. Then, let $\Lambda_i = \tau_{i(b[i])} = \pi - (4\lambda_i + 3\mu_i)$ and one has the following result.

Theorem 4.4: For a process-dominant K-cluster tool, if $\tau_{(i-1)(b[i-1])} < 4\lambda_i + 3\mu_i$ and $\Lambda_i < 4\lambda_{i+1} + 3\mu_{i+1}$, a one-wafer cyclic schedule with cycle time $\pi$ can be obtained for $C_i$ such that $t_{i0}$, $u_{i0}$, $t_{i(b[i])}$, and $u_{i(b[i])}$ can fire whenever they are scheduled to fire if and only if there are two buffer spaces in both BMs that link $C_{i-1}$ and $C_i$, and $C_i$ and $C_{i+1}$.

Proof Necessity: By $\tau_{(i-1)(b[i-1])} < 4\lambda_i + 3\mu_i$, it follows from Corollary 4.2 that the BM linking $C_{i-1}$ and $C_i$ must have two buffer spaces to obtain such a schedule for $C_i$. With two buffer spaces in the BM linking $C_{i-1}$ and $C_i$, it follows from Theorem 4.3 that $C_i$ can be scheduled by setting $\omega_{i(n[i])} = \psi_{i2}$. With $\omega_{i(n[i])} = \psi_{i2}$, one has $\Lambda_i = \tau_{i(b[i])} = \pi - (4\lambda_i + 3\mu_i)$ such that one cannot make $\tau_{i(b[i])} \geq 4\lambda_{i+1} + 3\mu_{i+1}$ true. Then, by Corollary 4.2, two buffer spaces in the BM linking $C_i$ and $C_{i+1}$ are necessary.

Sufficiency: This can be shown from Theorem 4.3 directly.

Theorem 4.4 presents the conditions under which two consecutive BMs need two buffer spaces to obtain a one-wafer cyclic schedule with cycle time $\pi$. It follows from Theorem 4.4 that one has the following corollary.

Corollary 4.3: For a process-dominant K-cluster tool, if $\tau_{(i-1)(b[i-1])} < 4\lambda_i + 3\mu_i$ and $\Lambda_i \geq 4\lambda_{i+1} + 3\mu_{i+1}$, a one-wafer cyclic schedule with cycle time $\pi$ can be obtained for $C_i$ such that $t_{i0}$, $u_{i0}$, $t_{i(b[i])}$, and $u_{i(b[i])}$ can fire whenever they are scheduled to fire if and only if there are two buffer spaces in the BM that links $C_{i-1}$ and $C_i$, and there is one buffer space in the BM that links $C_i$ and $C_{i+1}$.

When there are two buffer spaces in the BM linking $C_{i-1}$ and $C_i$, one can set $\omega_{i(n[i])} = \psi_{i2}$ such that $\tau_{i(b[i])} = \Lambda_i = \pi - (4\lambda_i + 3\mu_i)$, the largest value. In this way, one makes $\tau_{i(b[i])} \geq 4\lambda_{i+1} + 3\mu_{i+1}$ easier to be satisfied. Hence, only a few BMs that need two buffer spaces. Up to now, one has presented the conditions for obtaining a one-wafer cyclic schedule with cycle time $\pi$. Based on the results, then one can discuss how to schedule the system and configure the buffer spaces next.

C.2 Scheduling and Buffer Space Configuration Algorithm

In the last section, one presents the conditions for scheduling an individual tool to obtain a one-wafer cyclic schedule with the lower bound of cycle time $\pi$. Since there are multiple robots in a K-cluster tool, the key is to coordinate their activities in accessing BMs. To do so, one schedules individual tools from $C_i$ to $C_K$ one by one by using the method given in Section A. In this process, the conditions obtained in the last section are applied such that the buffer spaces are optimally configured.

Since the K-cluster tool discussed here is process-dominant, one has or $\pi \geq \pi_i$, or $\pi \geq \psi_{i1}$, $i \in \mathbb{N}_K$, and $\psi_{i2} = \pi - \psi_{i1} \geq 0$. Let $B_{i-1}$ be the number of buffer spaces in the BM linking $C_{i-1}$ and $C_i$. Then, the system can be scheduled and, at the same time, the buffer spaces can be configured as follows. For $C_1$, since the loadlocks are not shared with any other tool, one sets $\omega_{1(n[1])} = \pi \psi_{11} = \psi_{12}$ such that $\omega_{1j} = 0$, $j \in \Omega_{n[1]} \backslash \{n[1]\}$. In this way, a one-wafer cyclic schedule with cycle time $\pi$ is obtained. With $\omega_{1(b[1]-1)} = 0$, $\tau_{1(b[1])} = \Lambda_1$ is maximized such that the BM linking $C_1$ and $C_2$ needs the minimal number of buffer spaces.

Then, for $C_2$, according to the discussion in the last section, one checks if $\Lambda_1 \geq 4\lambda_2 + 3\mu_2$ is satisfied. If so, set $B_1 = 1$ and $\omega_{2(n[2])} = \Lambda_1 4\lambda_2 + 3\mu_2$ and $\omega_{2j}$, $j \in \Omega_{n[2]} \backslash \{b[2]-1, n[2]\}$, as large as possible such that $\omega_{2(j-1)} \leq \pi - \alpha_{2j} - 4\lambda_2 + 3\mu_2$. Then, set $\omega_{2(b[2]-1)} = \psi_{22} - \sum_{j=0}^{b[2]-2} \omega_{2j} - \sum_{j=b[2]}^{n[2]} \omega_{2j}$ such that $\omega_{2(b[2]-1)}$ is as small as possible and $\tau_{2(b[2])} = \pi - (4\lambda_2 + 3\mu_2 + \omega_{2(b[2]-1)})$ is as large as possible. In this way, a one-wafer cyclic schedule with cycle time $\pi$ is obtained for $C_2$. If $\Lambda_1 \geq 4\lambda_2 + 3\mu_2$ is not satisfied, set $B_1 = 2$, $\omega_{2(n[2])} = \psi_{22}$, and $\tau_{2(b[2])} = \Lambda_2$ to obtain a one-wafer cyclic schedule with cycle time $\pi$. For $C_i$, $i \in \mathbb{N}_{K-1} \backslash \{1, 2\}$, with $\tau_{(i-1)(b[i-1])}$ obtained for scheduling $C_{i-1}$, do the same for scheduling $C_2$ to set the number of buffer spaces $B_i$ and obtain the one-wafer cyclic schedule with cycle time $\pi$.

For $C_K$, one assigns each $\omega_{Kj}$, $j\in\Omega_{n[k]}$. If $\tau_{(K-1)(b[k-1])}\geq 4\lambda_K+3\mu_K+\omega_{K(n[k])}$ is satisfied, set $B_{K-1}=1$, otherwise set $B_{K-1}=2$ such that cycle time $\pi$ can be reached. In this way, a one-wafer cyclic schedule with cycle time $\pi$ for a K-cluster tool can be obtained and the buffer spaces are configured. This process is summarized into Algorithm 4.1.

Algorithm 4.1: Find the optimal one-wafer cyclic schedule and optimal buffer configuration for K-cluster tool.
Input: $\alpha_{ij}$, $\lambda_i$, $\mu_i$, $i\in\mathbb{N}_K$, $j\in\Omega_{n[i]}$
Output: $\omega_{ij}$, $i\in\mathbb{N}_K$, $j\in\Omega_{n[i]}$; $B_i$, $i\in\mathbb{N}_{K-1}$
i)

$$\text{Let } \prod = \max_{1\leq i\leq K}(\pi_i) \text{ and } B_i = 1$$

ii) Determine $\omega_{1j}$, $j\in\Omega_{n[1]}$ for $R_1$ as
1) For $j\leftarrow 0$ to $n[1]-1$ do
2) $\omega_{1j}\leftarrow 0$
3) end
4) $\omega_{1(n[1])}\leftarrow \pi-2(n[1]+1)(\lambda_1+\mu_1)$
5) $\tau_{1(b[1])}\leftarrow \pi-(4\lambda_1+3\mu_1)$ iii) Determine $B_{i-1}$, $\omega_{ij}$ for $C_i$, $2\leq i\leq K-1$, $j\in\Omega_{n[i]}$ as
1) For $i=2$ to $\leq K-1$ do
2) If $\tau_{(i-1)(b[i-1])}<4\lambda_i+3\mu_i$ then
3) $B_{i-1}\leftarrow B_{i-1}+1$
4) For $j\leftarrow 0$ to $n[i]-1$ do
5) $\omega_{ij}\leftarrow 0$
6) End
7) $\omega_{i(n[i])}\leftarrow \pi-2(n[i]+1)(\lambda_i+\mu_i)$
8) $\tau_{i(b[i])}\leftarrow \pi-(4\lambda_i+3\mu_i)$
9) Else
10) $\omega_{i(n[i])}\leftarrow \min\{\tau_{(i-1)(b[i-1])}-(4\lambda_i+3\mu_i), \pi-2(n[i]+1)(\lambda_i+\mu_i)\}$
11) For $j\leftarrow 0$ to $n[i]-1$ and $j\neq b[i]-1$ do
12) $\omega_{ij}\leftarrow \min\{\pi-(4\lambda_i+3\mu_i+\alpha_{i(j+1)}), \pi-2(n[i]+1)(\lambda_i+\mu_i)-\sum_{d=0}^{j-1}\omega_{id}-\omega_{i(n[i])}\}$
13) End
14) $\omega_{i(b[i]-1)}=\pi-\{2(n[i]+1)(\lambda_i+\mu_i)+\sum_{j=0}^{b[i]-2}\omega_{ij}+\sum_{j=b[i]}^{n[i]}\omega_{ij}\}$
15) $\tau_{i(b[i])}\leftarrow \pi-(4\lambda_i+3\mu_i+\omega_{i(b[i]-1)})$
16) End iv) Determine $B_{K-1}$, $j\in\Omega_{n[K]}$ for $R_K$ as.
1) For $j\leftarrow 0$ to $n[K]-1$ do
2) $\omega_{Kj}\leftarrow \min\{\pi-(4\lambda_K+3\mu_K+\alpha_{K(j+1)}), \pi-2(n[K]+1)(\lambda_K+\mu_K)-\sum_{d=0}^{j-1}\omega_{Kd}\}$
3) End
4) $\omega_{K(n[K])}\leftarrow \pi-2(n[K]+1)(\lambda_K+\mu_K)-\sum_{d=0}^{n[K]-1}\omega_{Kd}$
5) If $\tau_{(k-1)(b[k-1])}<4\lambda_k+3\mu_k+\omega_{K(n[K])}$
6) $B_{K-1}\leftarrow B_{K-1}+1$
7) End and return $B_i$, $i\in\mathbb{N}_{K-1}$ By examining Algorithm 4.1, it is known that, to find a one-wafer cyclic schedule with cycle time $\pi$ for a process-dominant K-cluster tool and configure the buffer spaces, only simple calculations are involved. Thus, the algorithm is very efficient. Since $\pi$ is the lower bound of cycle time, the obtained schedule is optimal in terms of productivity. One has the following result.

Theorem 4.5: The buffer space configuration obtained by Algorithm 4.1 is optimal.

Proof: Since only when $\tau_{i(b[i])}<4\lambda_{i+1}+3\mu_{i+1}$, $B_i$ is set to be $B_i=2$, otherwise, it is set to be $B_i=1$. Thus, if the number of BMs that need two buffer spaces is minimized, the buffer space configuration is optimal. By Algorithm 4.1, $\tau_{i(b[i])}$ is made to be as small as possible such that the number of cases with $\tau_{i(b[i])}<4\lambda_{i+1}+3\mu_{i+1}$ is minimized, leading to that the configuration is optimal.

C.3 Schedule Implementation

As discussion above, the schedule of a K-cluster tool obtained by Algorithm 4.1 is just for a steady-state. Since there is an initial transient process before a steady-state is reached. As shown in Section A, a system can reach its steady state from initial marking $M_0$ with all tokens in the system being virtual ones. Note that, in Section A, one sets $M_0(p_{i(b[i])})=0(M_0(p_{(i+1)0})=0)$, $i\in\mathbb{N}_{K-1}$. With such $M_0$, the obtained schedule cannot be realized. To realize the obtained schedule, one needs to change $M_0$ by putting $V_0$ tokens in the system as follows. For a BM linking $C_i$ and $C_{i+1}$, $i\in\mathbb{N}_{K-1}$, if $B_i=1$, set $M_0(p_{i(b[i])})=0$ $(M_0(p_{(i+1)0})=0)$; if $B_i=2$, set $M_0(p_{i(b[i])})=1$ $(M_0(p_{(i+1)0})=1)$ such that the token has color $c_{i(b[i])}$, or it enables $u_{i(b[i])}$. Then, starting from $M_0$, the system evolves just as in the steady state as follows. Whenever a token enters $q_{ij}$, $i\in\mathbb{N}_K$ and $j\in\Omega_{n[i]}$, it stays in $q_{ij}$ for $\omega_{ij}$ time units as scheduled and every time $u_{10}$ fires, a token W representing a real wafer is unloaded from $p_{10}$. When all virtual tokens $V_0$ are removed from the system, the system reaches its steady-state and it operates just as scheduled.

D. Illustrative Examples

In this section, one uses two examples to illustrate the applications of the proposed method.

Example 1

This is a 3-cluster tool from [Chan et al., 2011b]. The activity time is as, for $C_1$, $\alpha_{10}=0$ (the loadlocks), $\alpha_{11}=34$ s, $\alpha_{12}=0$ (BM$_1$), $\alpha_{13}=31$ s, $\alpha_{14}=4$ s, $\lambda_1=10$ s, and $\mu_1=1$ s; for $C_2$, $\alpha_{20}=0$ (BM$_1$), $\alpha_{21}=82$ s, $\alpha_{22}=0$ (BM$_2$), $\alpha_{23}=54$ s, $\alpha_{24}=12$ s, $\lambda_2=7$ s, and $\mu_2=1$ s; and for $C_3$, $\alpha_{30}=0$ (BM$_2$), $\alpha_{31}=54$ s, $\alpha_{32}=38$ s, $\alpha_{33}=91$ s, $\alpha_{34}=90$ s, $\lambda_3=3$ s, and $\mu_3=1$ s. It is solved with one-space BM in [Chan et al., 2011b] and a multi-wafer cyclic schedule is obtained with cycle time 114.8 s.

For $C_1$, one has $\zeta_{10}=\alpha_{10}+4\lambda_1+3\mu_1=0+4\times 10+3\times 1=43$ s, $\zeta_{11}=\alpha_{11}+4\lambda_1+3\mu_1=34+4\times 10+3\times 1=77$ s, $\zeta_{12}=43$ s, $\zeta_{13}=74$ s, $\zeta_{14}=47$ s, and $\psi_{11}=2(n[1]+1)(\mu_1+\lambda_1)=2\times(4+1)\times(10+1)=110$ s. Hence, $\pi_1=110$, and $C_1$ is transport-bound. For $C_2$, one has $\zeta_{20}=\alpha_{20}+4\lambda_2+3\mu_2=\zeta_{22}=\alpha_{22}+4\lambda_2+3\mu_2=0+4\times 7+3\times 1=31$ s, $\zeta_{21}=113$ s, $\zeta_{23}=85$ s, $\zeta_{24}=43$ s, and $\psi_{21}=2(n[2]+1)(\mu_2+\lambda_2)=2\times(4+1)\times(7+1)=80$ s. Hence, $\pi_2=113$, and $C_2$ is process-bound. For $C_3$, one has $\zeta_{30}=\alpha_{30}+4\lambda_3+3\mu_3=0+4\times 3+3\times 1=15$ s, $\zeta_{31}=69$ s, $\zeta_{32}=53$ s, $\zeta_{33}=106$ s, $\zeta_{34}=105$ s, and $\psi_{31}=2(n[3]+1)(\mu_3+\lambda_3)=2\times(4+1)\times(3+1)=40$ s. Hence, $\pi_3=106$ s, and $C_3$ is process-bound too. Because $\pi_2>\pi_1>\pi_3$ and $C_2$ is process-bound, the 3-cluster tool is process-dominant and the lower bound of cycle time is $\eta_1=\eta_2=\eta_3=\pi=\pi_2=113$ s.

By the proposed method, one has $\psi_{12}=\pi-\psi_{11}=3$ s, $\psi_{22}=\pi-\psi_{21}=33$ s, and $\psi_{32}=\pi-\psi_{31}=73$ s. By Algorithm 4.1, a one-wafer cyclic schedule is obtained by setting the $\omega_{ij}$'s as: for $C_1$, $\omega_{10}=\omega_{11}=\omega_{12}=\omega_{13}=0$ s, $\omega_{14}=3$ s, and $\tau_{12}=\pi-(4\lambda_1+3\mu_1)=113-43=70$ s; for $C_2$, $\omega_{20}=\omega_{21}=\omega_{22}=\omega_{23}=0$ s, $\omega_{24}=33$ s, and $\tau_{22}=\pi-(4\lambda_2+3\mu_2)=113-31=82$ s; and for $C_3$, $\omega_{30}=44$ s, $\omega_{31}=29$ s, $\omega_{32}=\omega_{33}=\omega_{34}=0$ s. Since $\tau_{12}=70>(4\lambda_2+3\mu_2)=31$ and $\tau_{22}=82>(4\lambda_3+3\mu_3)+\omega_{34}=15$, one does not need additional buffer space for both BMs. In this way, a one-wafer schedule is found with the cycle time 113 s instead of a multi-wafer schedule with cycle time 114.8 s as obtained in [Chan et al., 2011b].

Example 2

In a 3-cluster tool, the activity time is as: for $C_1$, $\alpha_{10}=0$ (the loadlocks), $\alpha_{11}=75$ s, $\alpha_{12}=0$ (BM$_1$), $\alpha_{13}=70$ s, $\lambda_1=10$ s, and $\mu_1=5$ s; for $C_2$, $\alpha_{20}=0$ (BM$_1$), $\alpha_{21}=0$ s (BM$_2$), $\alpha_{22}=7$ s, $\lambda_2=20$ s, and $\mu_2=1$ s; and for $C_3$, $\alpha_{30}=0$ (BM$_2$), $\alpha_{31}=5$ s, $\alpha_{32}=100$ s, $\lambda_3=5$ s, and $\mu_3=1$s.

For $C_1$, one has $\zeta_{10}=\alpha_{10}+4\lambda_1+3\mu_1=0+4\times10+3\times5=55$ s, $\zeta_{11}=\alpha_{11}+4\lambda_1+3\mu_1=75+55=130$ s, $\zeta_{12}=\alpha_{12}+4\lambda_1+3\mu_1=0+55=55$ s, $\zeta_{13}=\alpha_{13}+4\lambda_1+3\mu_1=70+55=125$ s, and $\psi_{11}=2(n[1]+1)\times(\lambda_1+\mu_1)=2(3+1)\times(10+5)=8\times15=120$ s, or $C_1$ is process-bound and $\pi_1=130$ s. For $C_2$, one has $\zeta_{20}=\alpha_{20}+4\lambda_2+3\mu_2=0+4\times20+3\times1=83$ s, $\zeta_{21}=\alpha_{21}+4\lambda_2+3\mu_2=0+83=83$ s, $\zeta_{22}=\alpha_{22}+4\lambda_2+3\mu_27+83=90$, and $\psi_{21}=2(n[2]+1)\times(\lambda_2+\mu_1)=2(2+1)\times(20+1)=6\times21=126$ s, or $C_2$ is transport-bound and $\pi_2=126$ s. For $C_3$, one has $\zeta_{30}=\alpha_{30}+4\lambda_3+3\mu_3=0+4\times5+3\times1=23$ s, $\zeta_{31}=\alpha_{31}+4\lambda_3+3\mu_3=5+23=28$ s, $\zeta_{32}=\alpha_{32}+4\lambda_3+3\mu_3=100+23=123$ s, and $\psi_{31}=2(n[3]+1)\times(\lambda_3+\mu_3)=2(2+1)\times(5+1)=36$, or $C_3$ is also process-bound and $\pi_3=123$ s. Since $\pi=\pi_1=130$ s$>\pi_2=126$ s$>\pi_3=123$ s and $C_1$ is process-bound, this 3-cluster tool is process-dominant. One needs to schedule the system such that $\eta_1=\eta_2=\eta_3=\pi=\pi_1=130$ s.

By the proposed method, one has $\psi_{12}=130-\psi_{11}=130-120=10$ s, and $\psi_{22}=130-\psi_{21}=130-126=4$ s, and $\psi_{32}=130-\psi_{31}=130-36=94$ s. By Algorithm 4.1, for $C_1$, one has $\omega_{10}=\omega_{11}=\omega_{12}=0$ s, $\omega_{13}=10$ s, $\tau_{12}=\pi-(4\lambda_1+3\mu_1)=130-55=75$ s. Then, one has $\tau_{12}=75<4\lambda_2+3\mu_2=83$. This implies that, to obtain a one-wafer cyclic schedule with cycle time 130, two buffer spaces should be configured for BM$_1$. With two buffer spaces in BM$_1$, $\omega_{2(n[2])}=\psi_{22}=4$ s is set. Hence, by Algorithm 4.1, for $C_2$, one has $\omega_{20}=\omega_{21}=0$ s, $\omega_{22}=4$ s, and $\tau_{21}=\pi-(4\lambda_2+3\mu_2)=130-(4\times20+3\times1)=47$ s. For $C_3$, by Algorithm 4.1, one has $\omega_{30}=94$ s, $\omega_{31}=\omega_{32}=0$ s. Since $\tau_{21}=47>4\lambda_3+3\mu_3+\omega_{32}=23$, no additional buffer space for BM$_2$ is needed and a one-wafer cyclic schedule with cycle time 130 s, the lower bound, is obtained.

It is complicated to schedule a multi-cluster tool. Since a one-wafer cyclic schedule is easy to implement and understand by practitioners, it is highly desirable to obtain such a schedule. Productivity is among the most important performance goals for a semiconductor manufacturer. It is known that the number of buffer spaces in a BM has effect on the performance of a multi-cluster tool. For a single-arm multi-cluster tool whose bottleneck tool is process-bound, the present invention investigates how to configure buffer spaces for its buffering modules to obtain one-wafer cyclic schedule such that the lower bound of cycle time is reached. To solve this problem, a PN model is developed for a K-cluster tool with a linear topology by extending the resource-oriented Petri net. Based on this model, the necessary and sufficient conditions under which a one-wafer cyclic schedule with the lower bound of cycle time are established such that the minimal number of buffer spaces for the buffering modules is configured. Based on the derived conditions, an algorithm is presented to find such a schedule and configure the buffer spaces optimally. This algorithm is computationally efficient. An effective method is also proposed to implement the obtained schedule.

The embodiments disclosed herein may be implemented using general purpose or specialized computing devices, computer processors, or electronic circuitries including but not limited to digital signal processors (DSP), application specific integrated circuits (ASIC), field programmable gate arrays (FPGA), and other programmable logic devices configured or programmed according to the teachings of the present disclosure. Computer instructions or software codes running in the general purpose or specialized computing devices, computer processors, or programmable logic devices can readily be prepared by practitioners skilled in the software or electronic art based on the teachings of the present disclosure.

In some embodiments, the present invention includes computer storage media having computer instructions or software codes stored therein which can be used to program computers or microprocessors to perform any of the processes of the present invention. The storage media can include, but is not limited to, floppy disks, optical discs, Blu-ray Disc, DVD, CD-ROMs, and magneto-optical disks, ROMs, RAMs, flash memory devices, or any type of media or devices suitable for storing instructions, codes, and/or data.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A computer implemented method for scheduling single-arm multi-cluster tools with optimal buffer space configuration, comprising:

obtaining, by a processor, a wafer processing time, a robot wafer loading and unloading time, and a robot moving time;

calculating, by a processor, a shortest time for completing a wafer based on the wafer processing time, the robot wafer loading and unloading time, and the robot moving time;

calculating, by a processor, a robot cycle time based on the robot wafer loading and unloading time, and the robot moving time;

determining, by a processor, a fundamental period based on selecting a maximum value among the shortest time for completing the wafer and the robot cycling time;

determining, by a processor, a type of cluster tool by:
    if the fundamental period is a value of the shortest time for completing the wafer, the type of cluster tool is process-bound;
    otherwise the type of cluster tool is a transport-bound;

determining, by a processor, the multi-cluster tools to be process-bound, or transport-bound based on the type of cluster tool having a maximum value of the fundamental period;

determining, by a processor, a lower bound of cycle time based on the maximum value of the fundamental period;

determining, by a processor, an algorithm for scheduling and buffer space configuration based on a petri net model; and calculating, by a processor, a robot waiting time based on the algorithm;

calculating, by a processor, a wafer sojourn time based on the algorithm and the lower bound of cycle time;

determining, by a processor, a buffer space for buffer module based on the wafer sojourn time and the robot waiting time; and obtaining, by a processor, a schedule based on the buffer space for buffer module and the lower bound of cycle time.

2. The method of claim 1, wherein the shortest time for completing the wafer is calculated by:

$\zeta_{ij}=\alpha_{ij}+4\lambda_i+3\mu_i$, $i\in \mathbb{N}_K$ and $j\in\Omega_{n[i]}$ $\zeta_{ij}$ denotes a shortest time for completing a wafer for a cluster tool i at step j;

$\alpha_{ij}$ denotes a wafer processing time for a cluster tool i at step j;

$\lambda_i$ denotes a robot wafer loading and unloading time for a cluster tool i;

$\mu_i$ denotes a robot moving time for a cluster tool i;

$\mathbb{N}_K$ denotes a total number of cluster tools; and $\Omega_{n[i]}$ denotes a total number of steps for a cluster tool i.

3. The method of claim 1, wherein the robot cycle time is calculated by:

$$\psi_i = 2(n[i]+1)(\lambda_i+\mu_i) + \Sigma_{j=0}^{n[i]} \omega_{ij}, i \in \mathbb{N}_K$$

$\psi_i$ denotes a robot cycle time for a cluster tool i;

$\lambda_i$ denotes a robot wafer loading and unloading time for a cluster tool i;

$\mu_i$ denotes a robot moving time for a cluster tool i;

$\Sigma_{j=0}^{n[i]} \omega_{ij}$ denotes a waiting time in a cycle for a cluster tool i; and $\mathbb{N}_K$ denotes a total number of cluster tools.

4. The method of claim 1, wherein the fundamental period is determined by:

$$\pi_i = \max\{\zeta_{i0}, \zeta_{i1}, \ldots, \zeta_{i(n[i])}, \psi_{i1}\}$$

$\pi_i$ denotes a fundamental period for a cluster tool i;

$\zeta_{i0}, \zeta_{i1}, \ldots, \zeta_{i(n[i])}$ denote shortest times for a cluster tool i at different steps; and $\psi_{i1}$ denotes a robot cycle time for a cluster tool i.

5. The method of claim 1, wherein the maximum value of the fundamental period $\pi$ is determined by:

$$\pi = \max\{\pi_1, \pi_2, \ldots, \pi_K\}$$

$\pi_1, \pi_2, \ldots, \pi_K$ denote different fundamental periods for different cluster tools.

6. A non-transitory computer-readable medium whose contents cause a computing system to perform a computer implemented method for scheduling single-arm multi-cluster tools with optimal buffer space configuration, the method comprising:

obtaining, by a processor, a wafer processing time, a robot wafer loading and unloading time, and a robot moving time;

calculating, by a processor, a shortest time for completing a wafer based on the wafer processing time, the robot wafer loading and unloading time, and the robot moving time;

calculating, by a processor, a robot cycle time based on the robot wafer loading and unloading time, and the robot moving time;

determining, by a processor, a fundamental period based on selecting a maximum value among the shortest time for completing the wafer and the robot cycling time;

determining, by a processor, a type of cluster tool by:

if the fundamental period is a value of the shortest time for completing the wafer, the type of cluster tool is process-bound;

otherwise the type of cluster tool is a transport-bound;

determining, by a processor, the multi-cluster tools to be process-bound, or transport-bound based on the type of cluster tool having a maximum value of the fundamental period;

determining, by a processor, a lower bound of cycle time based on the maximum value of the fundamental period;

determining, by a processor, an algorithm for scheduling and buffer space configuration based on a petri net model; and calculating, by a processor, a robot waiting time based on the algorithm;

calculating, by a processor, a wafer sojourn time based on the algorithm and the lower bound of cycle time;

determining, by a processor, a buffer space for buffer module based on the wafer sojourn time and the robot waiting time; and obtaining, by a processor, a schedule based on the buffer space for buffer module and the lower bound of cycle time.

7. The non-transitory computer-readable medium of claim 6, wherein the shortest time for completing the wafer is calculated by:

$$\zeta_{ij} = \alpha_{ij} + 4\lambda_i + 3\mu_i, i \in \mathbb{N}_K \text{ and } j \in \Omega_{n[i]}$$

$\zeta_{ij}$ denotes a shortest time for completing a wafer for a cluster tool i at step j;

$\alpha_{ij}$ denotes a wafer processing time for a cluster tool i at step j;

$\lambda_i$ denotes a robot wafer loading and unloading time for a cluster tool i;

$\mu_i$ denotes a robot moving time for a cluster tool i;

$\mathbb{N}_K$ denotes a total number of cluster tools; and $\Omega_{n[i]}$ denotes a total number of steps for a cluster tool i.

8. The non-transitory computer-readable medium of claim 6, wherein the robot cycle time is calculated by:

$$\psi_i = 2(n[i]+1)(\lambda_i+\mu_i) + \Sigma_{j=0}^{n[i]} \omega_{ij}, i \in \mathbb{N}_K$$

$\psi_i$ denotes a robot cycle time for a cluster tool i;

$\lambda_i$ denotes a robot wafer loading and unloading time for a cluster tool i;

$\mu_i$ denotes a robot moving time for a cluster tool i;

$\Sigma_{j=0}^{n[i]} \omega_{ij}$ denotes a waiting time in a cycle for a cluster tool i; and $\mathbb{N}_K$ denotes a total number of cluster tools.

9. The non-transitory computer-readable medium of claim 6, wherein the fundamental period is determined by:

$$\pi_i = \max\{\zeta_{i0}, \zeta_{i1}, \ldots, \zeta_{i(n[i])}, \psi_{i1}\}$$

$\pi_i$ denotes a fundamental period for a cluster tool i;

$\zeta_{i0}, \zeta_{i1}, \ldots, \zeta_{i(n[i])}$ denote shortest times for a cluster tool i at different steps; and $\psi_{i1}$ denotes a robot cycle time for a cluster tool i.

10. The non-transitory computer-readable medium of claim 6, wherein the maximum value of the fundamental period $\pi$ is determined by:

$$\pi = \max\{\pi_1, \pi_2, \ldots, \pi_K\}$$

$\pi_1, \pi_2, \ldots, \pi_K$ denote different fundamental periods for different cluster tools.

* * * * *